(12) United States Patent
Miyatake et al.

(10) Patent No.: US 6,178,108 B1
(45) Date of Patent: *Jan. 23, 2001

(54) SEMICONDUCTOR MEMORY DEVICE

(75) Inventors: Shinichi Miyatake, Hamura; Shigekazu Kase, Urawa; Masayuki Nakamura; Masatoshi Hasegawa, both of Ome; Kazuhiko Kajigaya, Iruma, all of (JP)

(73) Assignees: Hitachi, Ltd.; Hitachi ULSI Engineering Corp., both of Tokyo (JP)

( * ) Notice: Under 35 U.S.C. 154(b), the term of this patent shall be extended for 0 days.

This patent is subject to a terminal disclaimer.

(21) Appl. No.: 09/258,462

(22) Filed: Feb. 26, 1999

Related U.S. Application Data

(63) Continuation of application No. 08/982,457, filed on Dec. 2, 1997, now Pat. No. 5,963,467.

(30) Foreign Application Priority Data

Dec. 2, 1996 (JP) .................................................... 8-336444

(51) Int. Cl.[7] .................................................... G11C 11/24
(52) U.S. Cl. ......................... 365/149; 365/145; 365/195; 365/189.09; 365/226
(58) Field of Search ..................................... 365/145, 149, 365/226, 230.03, 195, 189.09

(56) References Cited

U.S. PATENT DOCUMENTS 5,754,466 * 5/1998 Arase .................................... 365/145

* cited by examiner

Primary Examiner—Huan Hoang
(74) Attorney, Agent, or Firm—Antonelli, Terry, Stout & Kraus, LLP

(57) ABSTRACT

In a semiconductor memory device having a plurality of memory cells in which each memory cell is formed of an address selection MOSFET and an information storing capacitor and the plate voltage consisting of an intermediate potential is supplied to the common electrode of the information storing capacitor, the memory access is enabled by detecting indirect that the plate voltage has reached the predetermined potential near the intermediate potential with the voltage detecting circuit or timer circuit, inhibiting the selecting operation of the word lines or precharging the pair bit lines to the intermediate potential when the plate voltage is lower than the predetermined potential, and then canceling the above inhibit condition after the plate voltage has reached the predetermined potential.

40 Claims, 16 Drawing Sheets

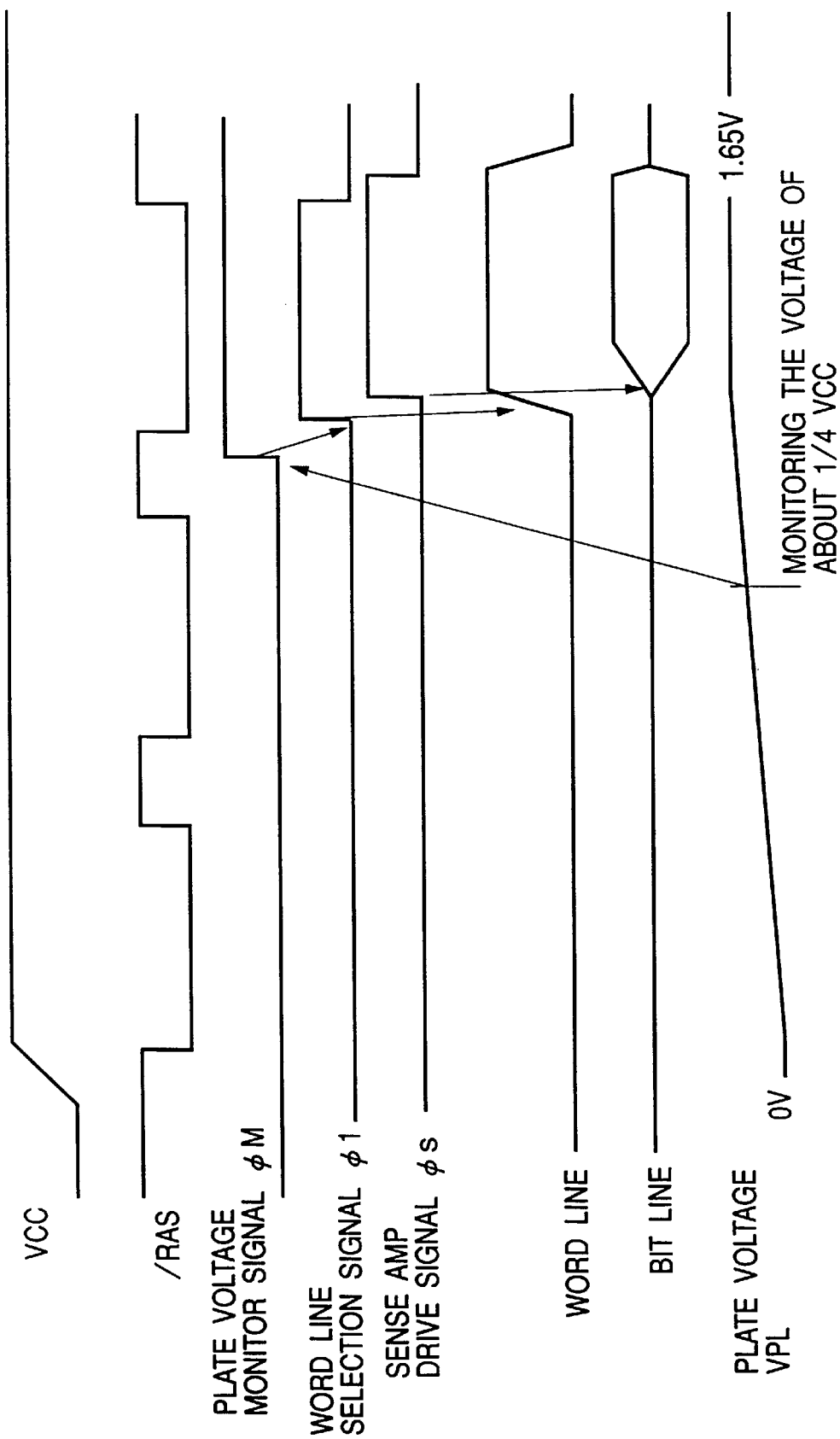

ed arranged in an array. FIG. 1 illustrated a portion of

SEMICONDUCTOR MEMORY DEVICE

This is a continuation of application Ser. No. 08/982,457, filed on Dec. 2, 1997, now U.S. Pat. No. 5,963,467, the entire disclosure of which is hereby incorporated by reference.

BACKGROUND OF THE INVENTION

The present invention relates to a semiconductor memory device and mainly to the technology which may be effectively applied to a dynamic RAM (Random Access Memory) of large capacity utilizing a high dielectric or ferro-dielectric material for a memory capacitor.

In a dynamic RAM, the memory capacity is increased to 1G bits from about 256M bits. In order to increase the memory capacity as explained above, the memory size must further be reduced.

Moreover, it is suggested in the Japanese Patent Application Laid-open Nos. SH062-84491 and HEI6-215563 that a circuit for supplying a voltage to the plate electrode of such a memory capacitor must be improved to improve the performance of a semiconductor memory device or to prevent malfunction thereof.

SUMMARY OF THE INVENTION

When a high dielectric material (for example, Ta2O5 film) or a ferro-dielectric material (for example, BST, PZT film) is used as the dielectric material for reduction in size of a memory capacitor, it has been proven through investigation by the inventors of the present invention that the following problems are generated. In the case of supplying an intermediate voltage to the plate (common) electrode of the memory capacitor, a comparatively longer time is required to keep the plate voltage of many capacitors connected in parallel at the intermediate voltage immediately after the power switch is turned on. However, in the dynamic RAM of the related art, no consideration is given to setting of the plate voltage, and when a control signal is input, the internal circuit starts its operation without relation to the rise of the plate voltage to enable a read or write operation.

However, according to the investigation by the inventors of the present invention, when an information memory capacitor is reduced in size, particularly by using a high dielectric material film or ferro-dielectric material film as explained above, the dielectric strength is rather low, giving an adverse effect to the characteristic itself, such as deterioration of the dielectric material film and the like.

It is therefore an object of the present invention to provide a semiconductor memory device which has a high integration density and high reliability with a simplified structure.

A summary of the typical features provided by the present invention will be explained briefly. That is, the semiconductor memory device comprises an address selection MOSFET and an information storing capacitor. In this semiconductor memory device having plurality of memory cells in which a plate voltage consisting of an intermediate potential is supplied to the common electrode of the information storing capacitors, a voltage detecting circuit or a timer circuit is used to directly detect that the plate voltage has reached a predetermined voltage near the intermediate voltage. When the plate voltage is less than the predetermined voltage, the word line selecting operation is inhibited or the pair bit lines are precharged to the intermediate voltage, and such operation is canceled after the plate voltage has reached the predetermined voltage to enable access to the memory device.

Other objects and advantages of the present invention will be apparent from the following detailed description of the presently preferred embodiments thereof, which description should be considered in conjunction with the accompanying drawings.

BRIEF DESCRIPTION OF THE DRAWINGS

FIG. 7 is a timing diagram for explaining the operation immediately after the power of the dynamic RAM of the present invention is turned ON.

FIGS. 11A and 11B are diagrams for explaining a voltage to be applied to the memory cell when the power is turned on.

FIG. 13 is a timing diagram for explaining operations which occur immediately after the power of the dynamic RAM of the other embodiment of the present invention is turned on.

FIG. 15 is a timing diagram for explaining outlines of the operation of the plate voltage generating circuit when the power is turned on.

DETAILED DESCRIPTION OF THE INVENTION

Figure 1:
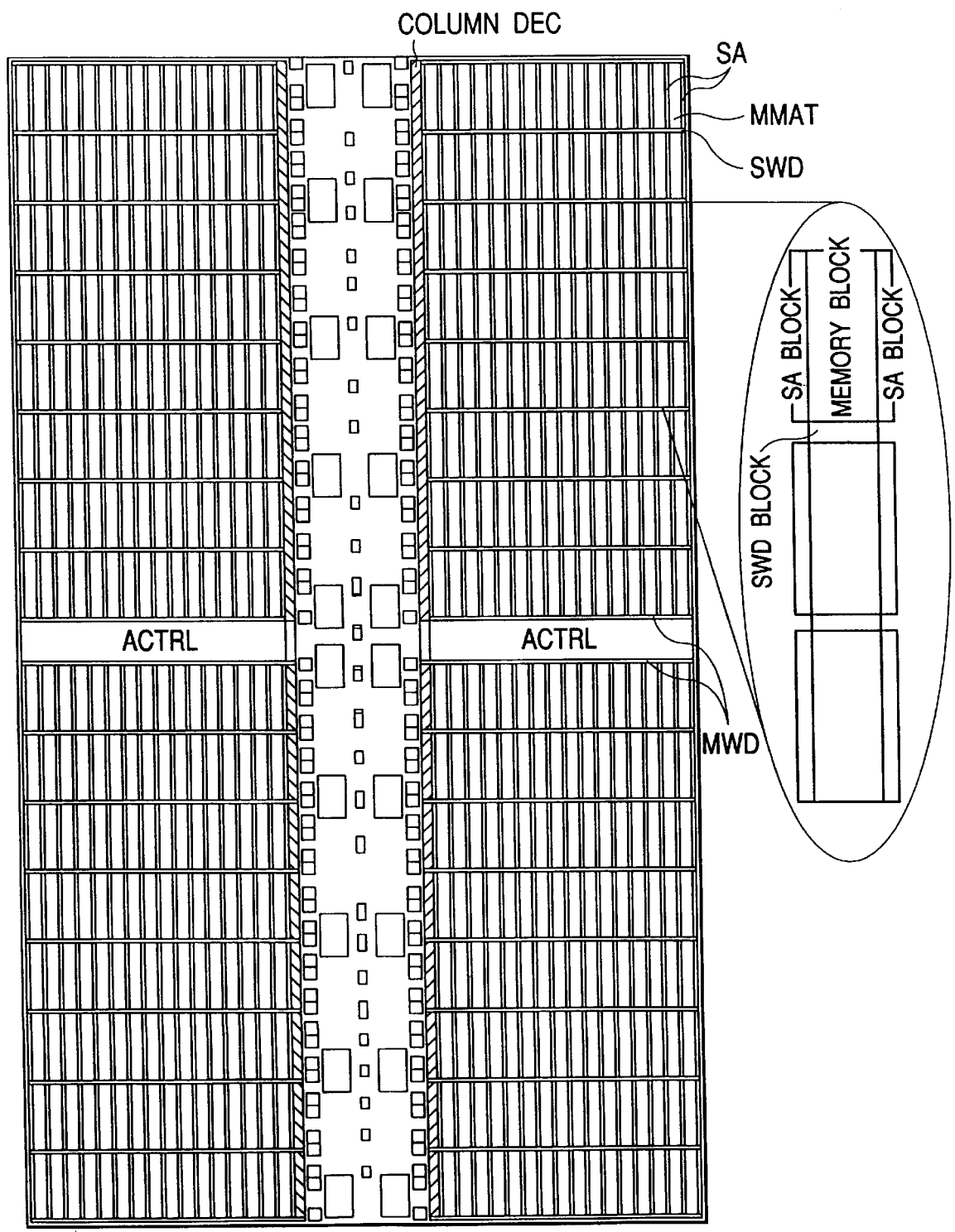
FIG. 1 is a schematic layout diagram showing an embodiment of the dynamic RAM of the present invention.

FIG. 1 is a schematic layout diagram of an embodiment of the dynamic RAM of the present invention. In this figure, the part in relation to the present invention among each circuit block forming a dynamic RAM is shown and such circuit block can be formed on one semiconductor substrates such as a single crystal silicon substrates by known semiconductor integrated circuit manufacturing technology.

The dynamic RAM of the present invention is destined, although the invention is not restricted to this example particularly, to have a storing capacity of about 64M(Mega) bits. The memory array as a whole is composed of memory blocks divided into four sections. Two memory arrays are respectively divided to the right end left sides in the longitudinal direction of the semiconductor chip and an input/output interface circuit consisting of an address input circuit, a data input/output circuit and a line of bonding pads and the power source generating circuit, etc. are provided at the center area.

As explained above, among four memory blocks where two blocks are provided horizontally while two blocks are provided vertically, with respect to the longitudinal direction of the semiconductor chip, the two memory blocks arranged vertically form a pair and a main word driver MWD is arranged at the center area therebetween. This main word driver MWD forms a selection signal of the main word line extended through one memory block. One memory block is connected with a dynamic memory cell having a memory capacity of 4K bits in the direction of the main word line and that of 4K bits in the direction of the pair of bit lines (referred to as data lines) which are crossing orthogonal to the main word line but are not illustrated here. Since such memory blocks are provided in a total of four blocks, the memory array is designed to have a memory capacity as large as 64M bits (4×4K×4K=64M bits).

One memory block referred to above is divided into eight sections in the main word line direction. A sub-word driver SWD is provided for each divided memory block. The sub-word driver SWD is divided into a ⅛ length for the main word line to form the selection signal of the sub-word lines extending in parallel with the main word line. In this embodiment, in order to reduce the number of main word lines, in other words, in order to alleviate the wiring pitch of the main word lines, four sub-word lines are arranged, although the invention is not restricted particularly, in the complementary bit line direction for one main word line. As explained above, one sub-word line is selected from the sub-word lines, which are divided into eight lines in the main word line direction and are assigned in four lines for the pair bit line, and a sub-word selection line, driver which will be described later is provided. This sub-word selection line driver forms a selection signal for selecting one sub-word selection line of four sub-word selection lines extending in the arrangement direction of the sub-word driver.

In the same figure, the element SA arranged to be parallel with the longitudinal direction of the semiconductor chip is a sense amplifier and the column Dec provided near the center of chip is a column decoder. The element ACTRL provided et the center to divide the memory block into upper and lower sections is an array control circuit which supplies the timing signal required for the address decoder and the operation.

As explained above, one memory array has a memory capacity of 4K bits in the complementary bit line direction. However, when the memory cells for 4K bits are connected to only one complementary bit line, the parasitic capacitance of the complementary bit line increases and the signal level read depending on the capacitance ratio with a fine information storing capacitor cannot be obtained. Therefore, the memory cell is divided into 16 sections also in the complementary bit line direction. specifically, the complementary bit line is divided into 16 sections by the sense amplifier SA.

Although the invention is not particularly restricted to the example, the sense amplifier SA is constituted by a shared sense system and the pair bit lines are provided in the right and left sides of the sense amplifier, except for the sense amplifiers arranged at respective sides of the memory array, and the sense amplifier is selectively connected to any of the right and left pair bit lines.

Figure 2:
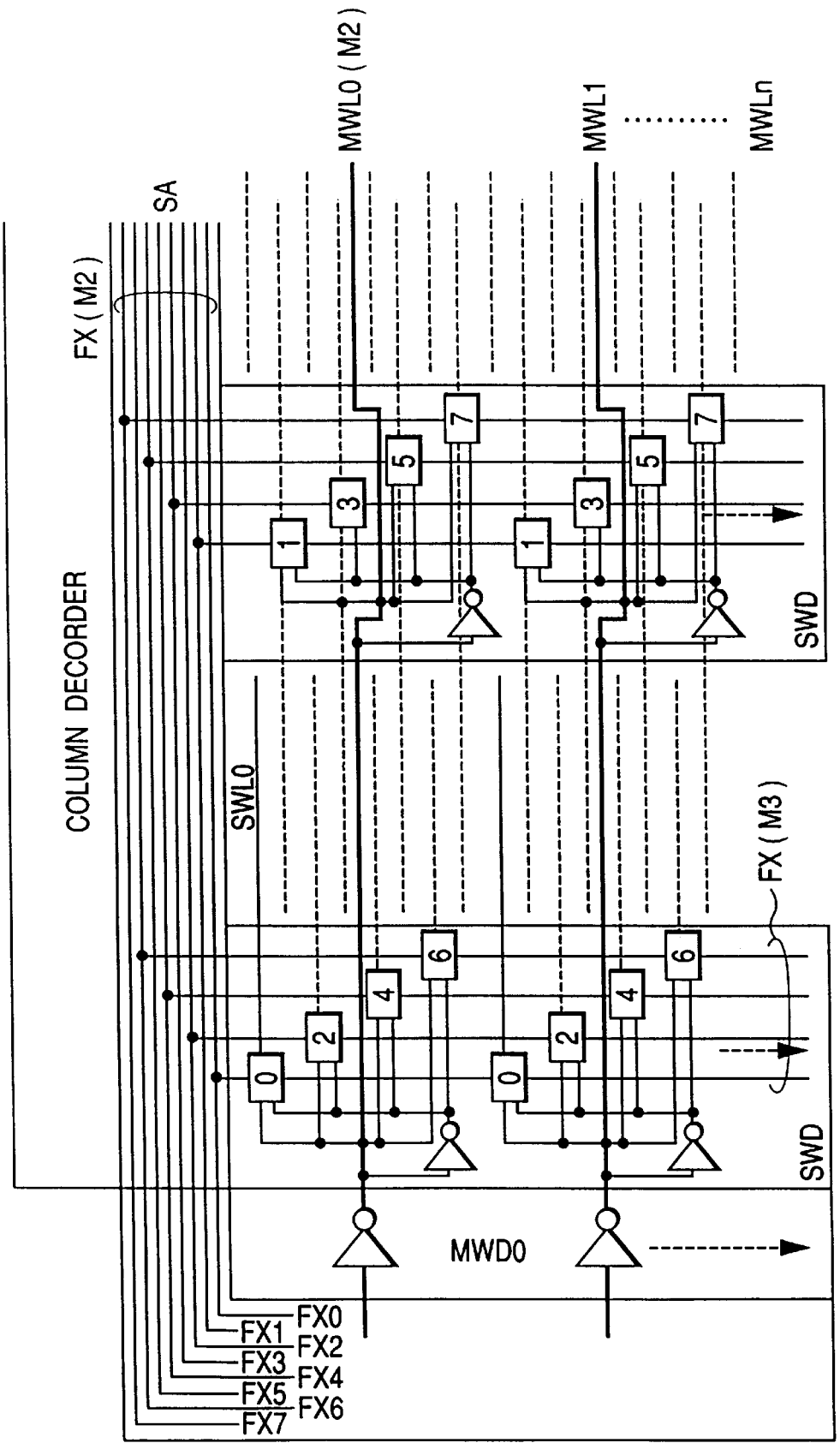
FIG. 2 is a schematic circuit diagram of an essential portion of the dynamic RAM for explaining a relationship between main word lines and sub-word lines of the memory array of the dynamic RAM of FIG. 1.

In FIG. 2, a block diagram of the essential portion of the memory is indicated for explaining the relationship between the main word line and the sub-word line of the memory array. In the figure, typical main word lines MWL0, MWL1 are indicated. The main word line MWLO is selected by the main word driver MWD0. The main word line MWL1 is also selected, in the same manner, by the main word driver MWD1.

The main word line MWL0 is provided with eight pairs of sub-word lines in its extending direction. In the figure, typical pairs of sub-word lines are illustrated as an example. As the sub-word lines SWL, a total of eight sub-word lines, four lines of even numbers from 0 to 6 and four lines of odd numbers from 1 to 7, are alternately arranged for one memory cell array. Except for the even number lines 0 to 6 adjacent to the main word driver and odd number lines 1 to 7 adjacent to the far end side (opposite side of the word driver) of the main word line, the sub-word driver SWD arranged between the memory cell arrays forms the selection signal for the sub-word lines of the right and left memory blocks in both sides thereof.

As explained above, since the memory block is divided into eight sections in the main word line direction, but the sub-word lines corresponding to two memory blocks are simultaneously selected substantially by the sub-word driver SWD as explained, the memory block is substantially divided into four sections. In the structure wherein the sub-word lines are divided into even number lines 0 to 6 and odd number lines 1 to 7 end the cub-word drivers SWD are arranged on both sides of the respective memory block, a substantial pitch of the sub-word lines SWL arranged in a high density in combination with arrangement of the memory cells can be alleviated up to two times in the sub-word drivers SWD, and the sub-word drivers SWD end cub-word lines SWLO, etc. can be arranged in an effective layout.

The sub-word driver SWD explained above supplies the selection signals in common to four sub-word lines 0 to 6 (1 to 7) and moreover supplies an inverted signal via the inverter circuit. A sub-word selecting line FX is also provided to select one sub-word line from among four sub-word lines. The sub-word selection line FX is formed of Bight lines FXO to FX7 and the even number cub-word selection lines FXO to FX6 among the eight lines FXO to FX7 are connected to the even number sub-word drivers 0 to 6, while the odd number selection lines FX1 to FX7 are connected to the odd number sub-word drivers 1 to 7. Although the invention is not particularly so restricted, the sub-word selection lines FXO to FX7 are formed, in the periphery of array, of a metal wiring layer M2 of the second layer and of a metal wiring layer M3 of the third layer in the intersecting portions of the main word lines MWLO to MWLn formed of the metal wiring layer M2 of the second layer.

Figure 3:
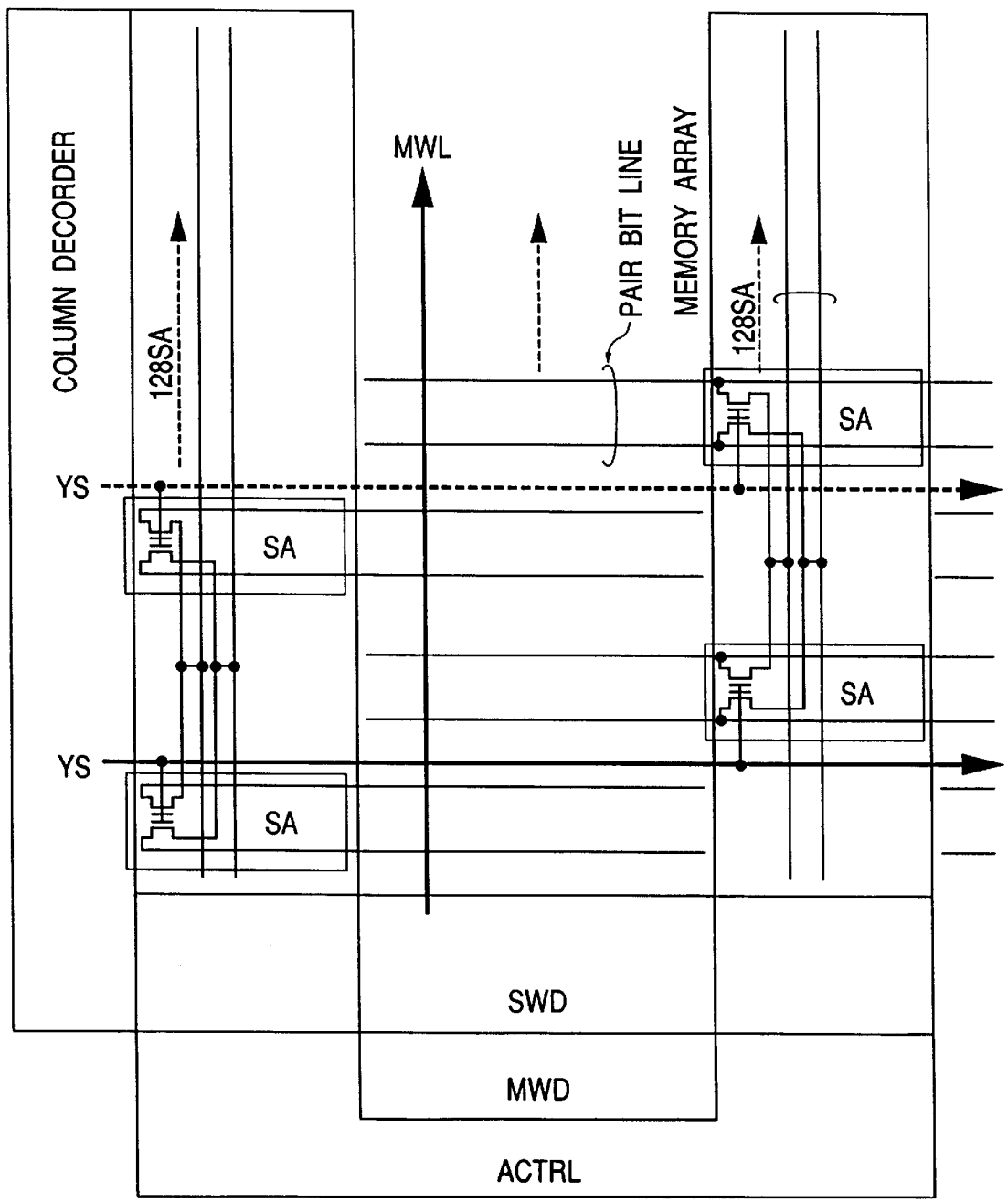
FIG. 3 is a schematic circuit diagram of the essential portion of the dynamic RAM for explaining a relationship between main word lines and a sense amplifier of the dynamic RAM of FIG. 1.

FIG. 3 is block diagram of the essential portion of the memory for explaining the main word lines and sense amplifier. In this figure, the main word line MWL is selected by the main word driver MOOD. The sub-word driver SWD corresponding to the even number sub-word lines is provided adjacent to the main word driver.

In this figure, the pair of bit lines is also provided in such a manner as to orthogonally cross the sub-word line (not illustrated) disposed in parallel with the main word line MWL. In this embodiment, although the invention is not particularly so restricted, the bit line pair is also divided into even number lines and odd number lines and the sense amplifiers SA are shared to the right and the left sides of the memory cell array corresponding to such even end odd number lines. The sense amplifier SA introduces the shared sense system, but the sense amplifier SA at the end portion is not provided with the substantially single-sided pair of bit lines, but is connected to the bit line pair via the shared switch MOSFET, as will be described later.

In the structure where the sense amplifiers SA are dispersed in both sides of the memory block as explained previously, the pitch of the sense amplifier can be alleviated in order to share the pair of bit lines with the even and odd number lines. On the contrary, while the pair of bit lines are arranged in a high density, the element area can be acquired to form the sense amplifier SA. Along with the arrangement of the sense amplifier SA, the input/output lines are disposed. This input/output line is connected to the bit line pair via a column switch The column switch is formed of a switch MOSFET. The gate of this switch MOSFET is connected to the column selection line YS to which the column decoder selection signal is transferred.

Figure 4:
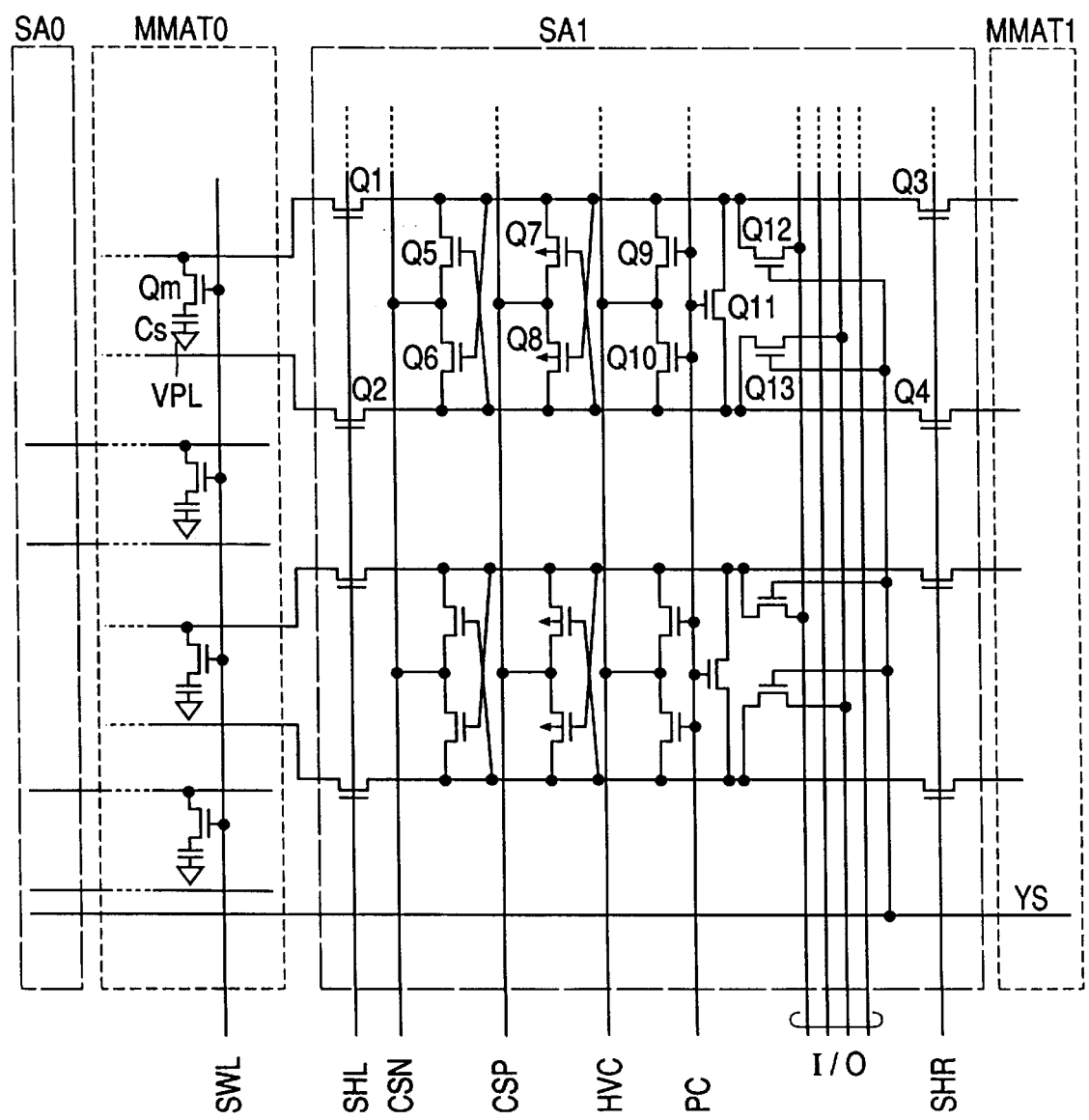
FIG. 4 is a schematic circuit diagram showing an embodiment of the sense amplifier of the dynamic RAM of the present invention.

FIG. 4 is a circuit diagram of the essential portion of an embodiment of the sense amplifier used in the dynamic RAM of the present invention. In this figure, a sense amplifier SA1 arranged between the memory cell arrays MMAT0 and MMAT1 and the circuit related to such sense amplifier are indicated. The memory cell array (memory mat) MMAT1 is indicated as a dashed line box and the sense amplifier SA0 provided at the end portion is also indicated as a dashed line box.

Four dynamic memory cells are indicated as a typical example corresponding to the sub-word line SWL provided at the memory mat MMAT0. A dynamic memory cell is composed of an address selection MOSFETQm and an information storing capacitor Cs. The gate of the address selection MOSFETQm is connected to the sub-word line SWL, the drain (or source) of this MOSFETQm is connected to the bit line and an accumulation node formed of one electrode of the information storing capacitor Cs is connected Lo the source (or drain). The other electrode of the information storing capacitor Cs is used as the common electrode and a plate voltage VPL, as will be explained later, is supplied to this electrode.

Respective bit line pairs are arranged in parallel as shown in the figure and these bit line pairs are crossed as required to keep a balance of capacitance. Such bit line pairs are connected to the input/output node of the unit circuit of the sense amplifier SA1 with the shared switch MOSFETQ1 and MOSFET Q2. The unit circuit of the sense amplifier SA1 is composed of the N-channel MOSFETQ5, MOSFETQ6 and the P-channel MOSFETQ7, MOSFETQ8 in which the gate and drain electrodes are cross-connected in the form of a latch.

The sources of the N-channel MOSFETQ5 and MOSFETQ6 are connected to the common source line CSN. The sources of the P-channel MOSFETQ7 and MOSFETQ8 are connected Lo the common source line CSP. The common source lines CSN and CSP are provided, although not illustrated, with the power switch MOSFET of the N-channel MOSFET and the P-channel MOSFET. Thereby, the power switch MOSFET is turned ON by the activation signal of the sense amplifier to supply the voltage required for operation of the sense amplifier.

The input/output node of the unit circuit of the sense amplifier SA1 is provided with a precharge circuit consisting of the MOSFET 11 for terminating the pair bit line and the switch MOSFETQ9 and MOSFETQ10 for supplying the half-precharge voltage HVC to the bit line pair. To the gates of the MOSFETQ9 to MOSFETQ11, a precharge signal PC is supplied in common. MOSFETQ12 and MOSFETQ13 form a column switch which is switch-controlled by the column selection signal YS. In this embodiment, four pairs of bit lines can be selected using only one column selection signal YS. That is, a similar column switch is also provided even in the sense amplifier SA0 indicated by the dash line. As explained, the sense amplifiers SA0 and SA1 on both sides of the memory mat MMAT0 are provided corresponding to the even number bit lines and the odd number bit lines.

Therefore, the column selection signal YS can select a total of four pairs of bit lines corresponding to two pairs of bit lines illustrated as an example on the side of the sense amplifier SA1 and the remaining two pairs of bit lines (not illustrated) to be provided in the side of the sense amplifier SA0. These two pairs of bit lines are connected to two pairs of common input/output lines I/O via the column switch explained above.

The sense amplifier SA1 is connected to the odd number bit line pairs of the memory mat MMAT1 via the shared switch MOSFETQ3 and MOSFETQ4. The even number bit line pairs of the memory mat MMAT1 are connected to the sense amplifier SA2 (not illustrated) arranged at the right side of the memory mat MMAT1 via the shared switch MOSFET corresponding to the shared switch MOSFETQ1 and MOSFETQ2 explained above. With such a repeated pattern, the memory array is connected to the sense amplifier provided between divided memory mats (memory array explained above).

For instance, when the sub-word line SWL of the memory mat MMAT0 is selected, the shared switch MOSFET on the right side of the sense amplifier SA0 and the shared switch MOSFETQ1 and MOSFETQ2 on the left side of the sense amplifier SA1 are turned ON. However, the sense amplifier SA0 at the end part thereof is provided only with the right side shared switch MOSFET. The signal SHL is the left side shared selection signal, while the signal SHR is the right side shared selection signal.

Figure 5:
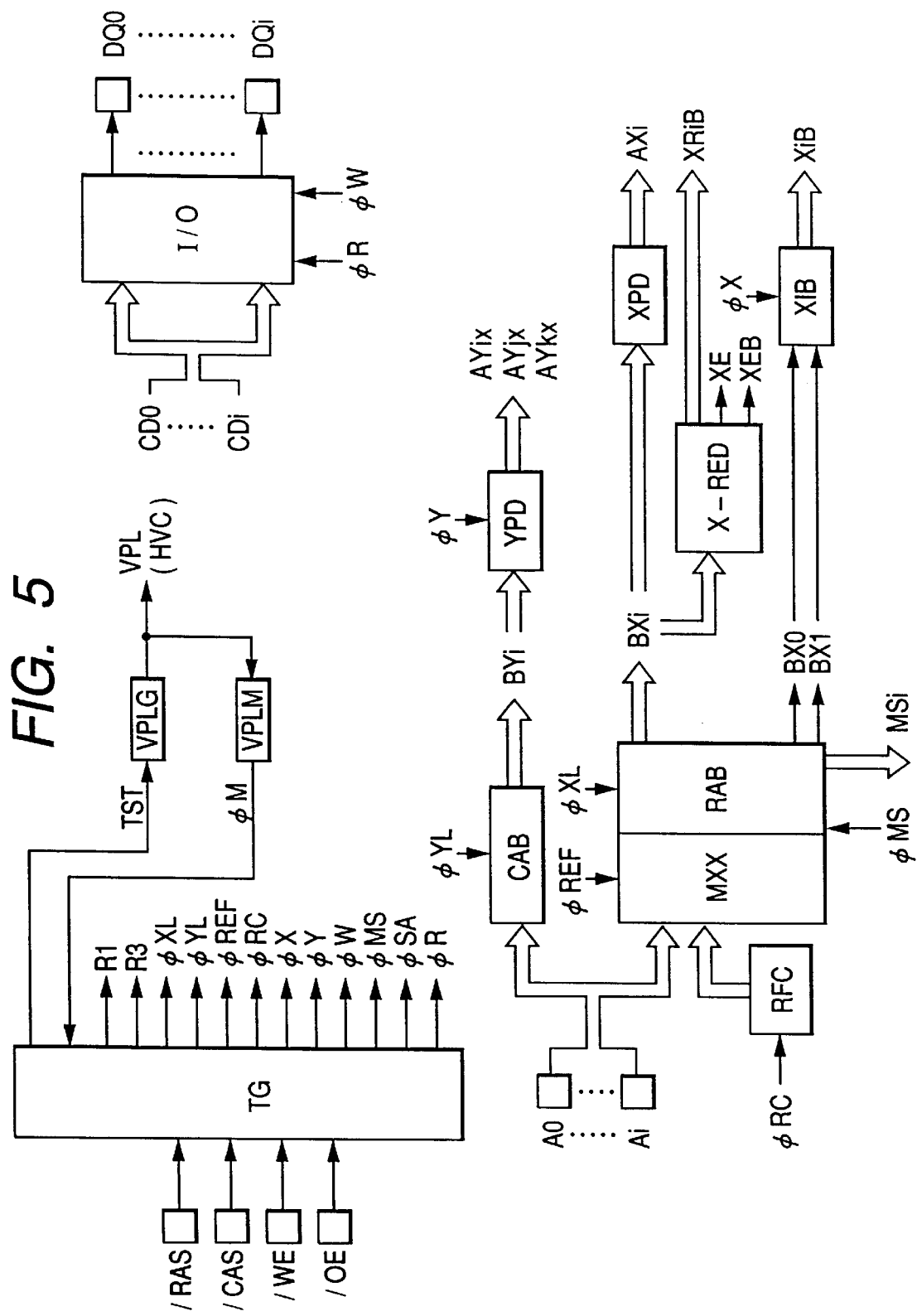
FIG. 5 is a schematic block diagram showing an embodiment of the peripheral portion of the dynamic RAM of the present invention.

FIG. 5 is a schematic block diagram of an embodiment of the peripheral portion of the dynamic RAM of the present invention. The timing control circuit TG receives the row address strobe signal /RAS, column address strobe signal /CAS, write enable signal /WE end output enable signal /OK supplied from external terminals and forms various timing signals which are required for determining the operation mode and corresponding operations of the internal circuits. In this specification and the drawings, the symbol/means that the low level is the active level.

The signals R1 and R3 are internal timing signals for a row and are used for selecting the operation of a row. A timing signal $\phi XL$ fetches the row address end holds it and it is supplied to a row address buffer RAB. That is, the row address buffer RAB fetches the addresses input from the address terminals AO to Ai with the timing signal $\phi XL$ and then holds it in the latch circuit.

A timing signal $\phi YL$ fetches the column address and holds it and it is supplied to a column buffer CAB. Namely, the column address buffer CAB fetches the column address signal input from the address terminal with the timing signal $\phi YL$ and holds it in the latch circuit.

A signal φREF is generated in the refresh mode and is then supplied to a multiplexer MXX provided at the input portion of the row address buffer to control switching of the signal to the refresh address signal formed by the refresh address counter circuit RFC in the refresh mode. The refresh address counter circuit RFC counts up the counting pulses for refresh formed by the timing control circuit TG to generate the refresh address signal. In this embodiment, auto-refresh and self-refresh are provided.

A timing signal φX is a word line selection timing signal to be supplied to a decoder XIB to form four kinds of word line selection timing signals XiB on the basis of the decoded lower two bits of the address signal. A timing signal φY is a column selection timing signal to be supplied to a column predecoder YPD to output the column selection signals AYiX, Ayjx, Aykx.

A timing signal φW is a control signal for instructing the write operation and a timing signal φR is a control signal for instructing the read operation. These timing signals φW and φR are supplied to the input/output circuit I/O to activate, in the case of the write operation, the input buffer included in the input/output circuit I/O to keep the output buffer in the output high impedance condition. Meanwhile, in the case of the read operation, these timing signals activate the output buffer to keep the input buffer in the output high impedance condition.

A timing signal φMS is a signal, although the invention is not restricted particularly, for instructing a memory array selecting operation to be supplied to a row address buffer RAB. In synchronization with this timing, the selection signal MSi is output. The timing signal φSA instructs operation of the sense amplifier. On the basis of this timing signal φSA, the sense amplifier activation pulse SAE, to be explained later, is generated.

In this embodiment, a typical redundant circuit X-RED for a row is illustrated. Specifically, the circuit X-RED includes a memory circuit for storing defective addresses and an address comparing circuit. If mismatching is found in comparison between the stored defective address and internal address signal Bxi output from the row address buffer RAB, the signal XE becomes high level and the signal XEB becomes low level for effectively operating the normal circuit. When the input internal address signal Bxi matches the stored defective address, the signal XE is converted to low level to inhibit the selecting operation for the defective main word line of the normal circuit and the signal XEB is converted to high level to output the selecting signal XRiB for selecting one backup main word line.

The plate voltage generating circuit VPLG receives the power supply voltage VCC supplied from the external terminal (not illustrated) and the ground voltage VSS of the circuit and generates a plate voltage corresponding to the intermediate voltage of high level and low level of the bit line pair to supply it to the common electrode (plate) of the memory cell. Although this invention is not particularly so restricted, this plate voltage may be used in common with the half precharge voltage HVC of the bit line pair. Otherwise, it is also possible that the intermediate voltage is generated and is output as the plate voltage VPL or half precharge voltage HVC in such a manner as to eliminate a mutual influence via the output circuit, respectively.

In this embodiment, a voltage detecting circuit VPLM is provided for monitoring the plate voltage. This voltage detecting circuit VPLM is set to the predetermined reference voltage near the intermediate voltage to compare the reference voltage with the plate voltage VPL to form a comparison output signal φM. This comparison signal φM is supplied to the timing control circuit TG. The timing control circuit TG is inhibited from generating the row timing signals R1, R3, etc. by means of the comparison output signal φM when the plate voltage is lower then the predetermined voltage. For instance, even when the /RAS signal is set to the low level to allow access to the memory by operating the row address selecting circuit, the word line selecting operation is inhibited or the precharge circuit of the bit line pair can maintain the precharge operation.

The timing control circuit TG explained above effectively generates the row timing signals R1, R3, etc. with the comparison output signal φM when the plate voltage becomes higher than the predetermined voltage. For example, when the /RAS signal is set to the low level and access is made to the memory by operating the row address selection circuit, the timing signals R1, R3, etc. are generated and the precharging operation of the precharge circuit is terminated, and the word line selecting operation or operation of sense amplifier is started.

Although the invention is not restricted particularly, the voltage detecting circuit VPLM is invalidated to allow operation with a test signal TST generated in the test mode. Specifically, in the test mode, operation of the voltage detecting circuit VPLM is substantially stopped and the detecting output signal φM is invalidated. That is, even if this detecting output signal φM indicates that the plate voltage is lower than the predetermined voltage, the function for inhibiting memory access is invalidated. In other words, the memory access can be realized from the external side without relation to the plate voltage.

Figure 6:
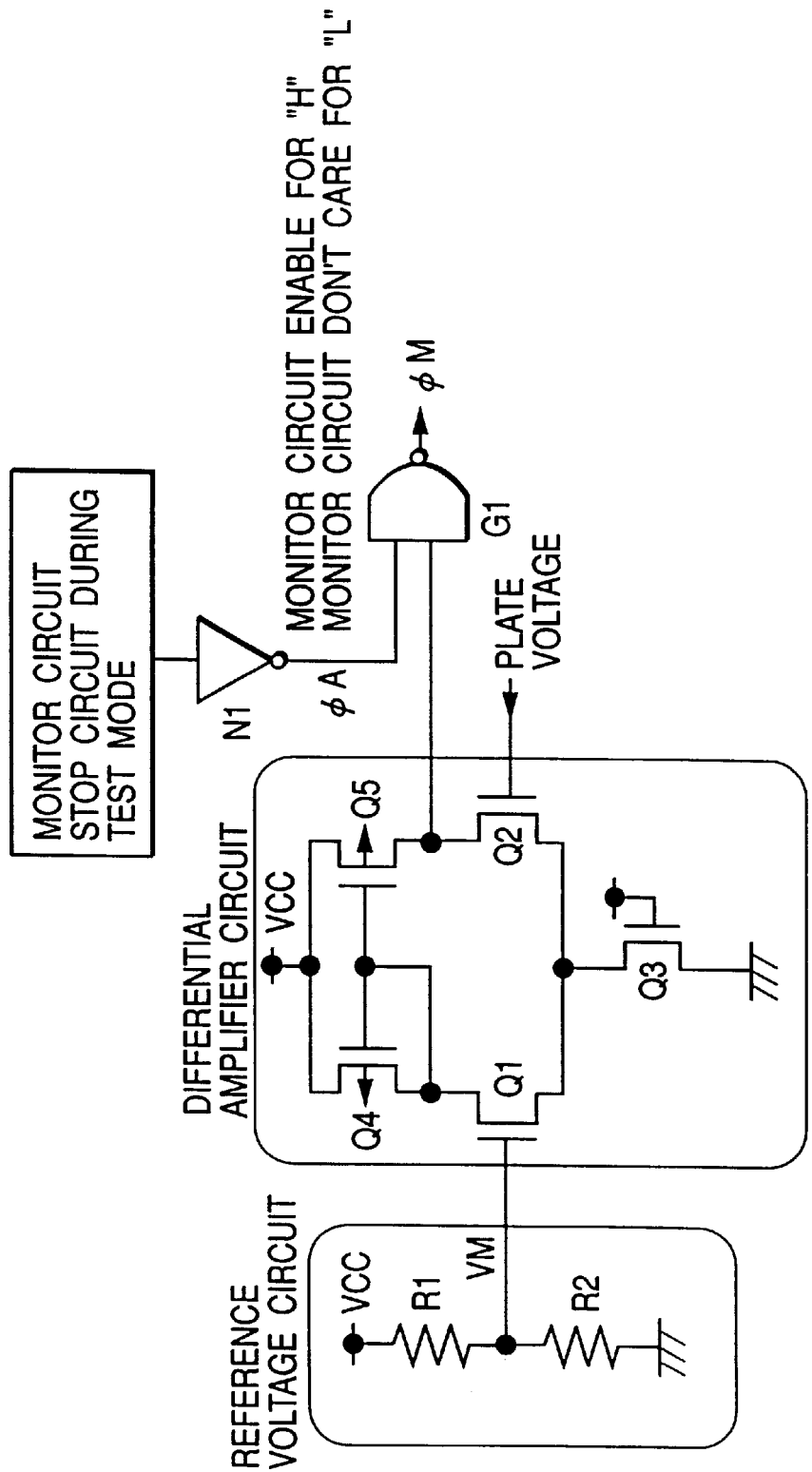
FIG. 6 is a schematic circuit diagram showing an embodiment of a voltage detecting circuit shown in FIG. 5.

FIG. 6 is a circuit diagram of an embodiment of the voltage detecting circuit. Each circuit element of this figure is partly overlapped with the circuit element shown in FIG.4 end these elements have individual circuit functions. In this embodiment, a voltage comparing circuit using a differential circuit is used, although the invention is not particularly so restricted. The reference voltage (monitor voltage VM), formed by dividing the power supply voltage using the resistors R1 and R2, is supplied to the gate of the differential MOSFETQ1. That is, the monitor voltage VM is set to the voltage, VM=R2×VCC/(R1+R2). This monitor voltage VM is set to about 1V, which is higher than VCC/4, because when the power supply voltage VCC is 3.3V, the plate voltage VPL is set to 1.65V, which is about a half of the power supply voltage, to prevent deterioration of dielectric strength of the dielectric material film of the information storing capacitor.

To the gate of the differential MOSFETQ2, which is paired with the differential MOSFETQ1, the plate voltage VPL is supplied. A MOSFETQ3 for generating a bias current is provided between the common source of MOSFETQ1 and MOSFETQ2 and the ground potential point. In order to reduce the current consumed by the differential circuit, MOSFETQ3 is formed to be small in size to allow only the minimum current required for the voltage comparing operation to flow. The MOSFETQ1 to MOSFETQ3 are formed as a N-channel type device. The drains of MOSFETQ1 and MOSFETQ2 are provided with a current Miller type load circuit consisting of P-channel MOSFETQ4 and MOSFETQ5. The above voltage comparing circuit turns ON the MOSFETQ1, when VM>VPL, to form a high level output signal, and, when VM<VPL, inverts the output signal to form a low level output signal.

The above output signal obtained from the common drain of MOSFETQ2 and MOSFETQ5 is output, although the invention is not particularly so restricted, as the above detected output signal φM via the NAND gate circuit G1. To the other input of the NAND gate circuit G1, the signal for stopping the monitor circuit during the test mode is supplied as the control signal φA via the inverter circuit N1. That is, when the signal φA is high level ('H'), the monitor circuit is enabled end the voltage comparing output is inverted by the NAND gate circuit G1 and is then output as the voltage detecting signal (plate voltage monitor signal) φM. When the signal φA is low level ('L'), the voltage detecting signal φM is set to high level without relation to the voltage comparing output, not considering the monitor circuit. Thereby, in the test mode, even when VM>VPL, the signal φM is set to high level, enabling access to the memory, as will be explained later.

FIG. 7 shows schematic waveforms for explaining the operation of the dynamic RAM of the present invention immediately after the power is turned ON. When power is turned ON, the power supply voltage VCC rises. Even when memory access is made, immediately after such power source voltage rises, by setting the row address strobe signal /RAS to the low level, since the above plate voltage VPL has a large parasitic capacitance due to a large number of memory cells being connected in common, the voltage can only gradually rise even with a comparatively large time constant.

In this case, since the above plate voltage VPL is lower than the monitor voltage VM in the voltage detecting circuit, the plate voltage monitor signal φM is set to the low level. Therefore, even when the signal /RAS is set to the low level, the word line selecting signal φ1, and the sense amplifier driving signal φs are kept at the low level. Thereby, the word line is in the non-selecting condition and the bit line is maintained at the precharge voltage corresponding to the plate voltage VPL. Therefore, a voltage difference is not substantially generated across both electrodes of the information storing capacitor and an unwanted high voltage is never applied thereto, and accordingly the high dielectric material film or ferro-magnetic material film is never deteriorated.

When the plate voltage VPL rises up to about 1V or so, which is higher than ¼ VCC, the voltage detecting circuit sets the plate voltage monitor signal φM to the high level. Therefore, when the signal /RAS is set to the low level, the word line selection signal φ1 and sense amplifier drive signal φs are generated to select the word line corresponding to the input address signal, and thereby the potential of the bit line is changed to the high level/low level by the amplifying operation of the sense amplifier.

In this case, in the information storing capacitor of the memory cell connected to the bit line due to the word line selecting operation, the plate voltage VPL rises up to about 1V, only 2.2V of the bit line potential of 3.3V set to the high level is impressed across both electrodes of the capacitor to be transferred to the accumulation node and only 1V is applied across both electrodes of the capacitor in which the potential 0V of the bit line being set to the low level is transferred to the accumulation node.

In the dynamic RAM where such a plate voltage monitor function does not exist, when the word line is selected and the sense amplifier operates under the condition that the plate voltage VPL is almost 0 immediately after the power is turned ON, a voltage as high as 3.3V is applied across both electrodes of the capacitor where the potential of 3.3V of the bit line being set to the high level is transferred to the accumulation node. This voltage of 3.3V is a higher voltage an the ordinary operation and is also higher then the voltage during the aging where the power supply voltage VCC is set to a voltage as high as 5.3V. In other words, during ordinary operation, since the plate voltage VPL becomes equal to 1.65V(VCC/2), only 1.65V is applied across both electrodes of the capacitor, depending on the high/low level of the bit line, and only 2.65V (VCC/2) is applied during the aging.

In this embodiment, since the voltage of 2.65V during the aging is the maximum voltage which is applied to both electrodes of the information storing capacitor by adding the plate voltage monitor function, it is enough when the high dielectric material film or ferro-dielectric material film is manufactured to have a predetermined dielectric strength for such voltage.

Figure 8A:
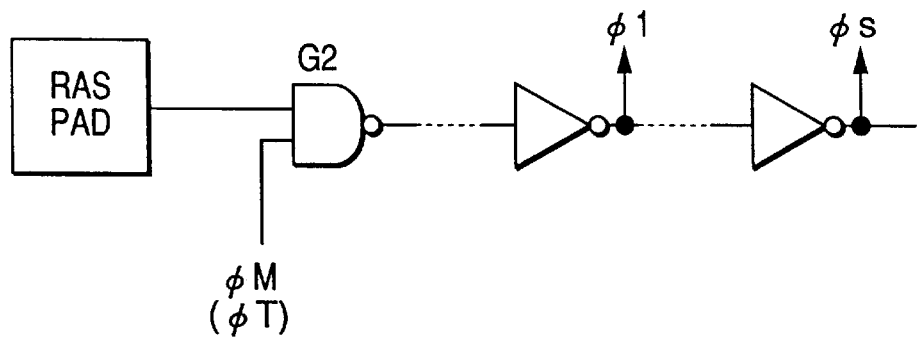
FIGS. 8A, 8B and 8C are schematic circuit diagrams for explaining a control circuit for the timing signals for rows of the dynamic RAM of the present invention.
Figure 8B:
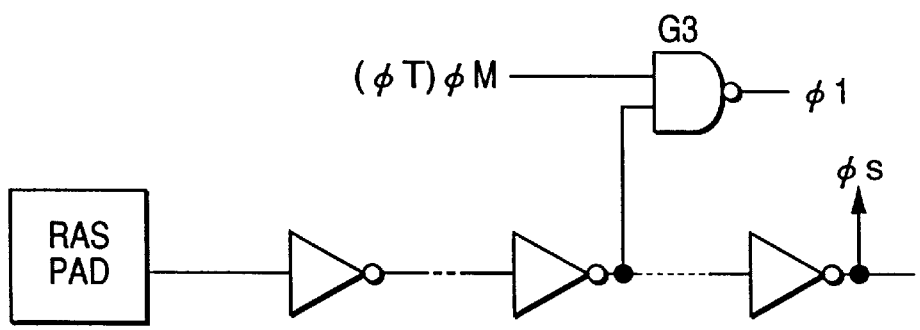
Figure 8C:
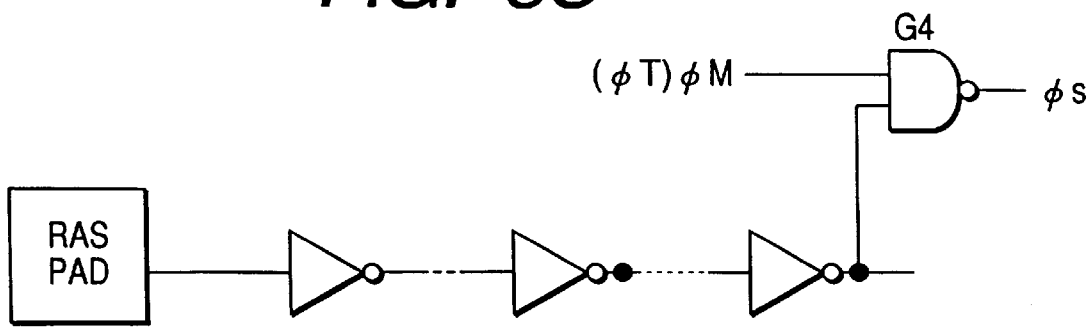

FIGS. 8A, 8B and 8C are circuit diagrams for explaining the control circuit of the timing signal for a row in the dynamic RAM of the present invention. In FIG. 8A, a NAND gate circuit G2 is used for the input buffer to receive the input signal from the RAS pad, and this NAND gate circuit G2 is controlled by the plate voltage monitor signal φM. Thereby, when the signal φM is low level, the gate of the gate circuit G2 is closed to inhibit input of the input signal (/RAS) for the purpose of inhibiting both word line selection signal φ1 and sense amplifier drive signal φs.

In FIG. 8B, only the word line selecting operation is inhibited by providing a NAND gate circuit G3 in the route forming the word line selection signal φ1 and by controlling such gate circuit G3 with the plate voltage monitor signal φM. That is, when the word line is in the non-selected condition, even if the sense amplifier is activated and the potential of the bit line is changed to a high/low level, the information storing capacitor of the memory cell is not connected to the bit line and it is possible to prevent a high voltage from being applied to the information storing capacitor of the memory cell immediately after the power supply is turned ON.

In FIG. 8C, the amplifying operation of the sense amplifier is inhibited by providing a NAND gate circuit G4 in the route forming the sense amplifier drive signal φs and by controlling the gate circuit G4 with the plate voltage monitor signal φM. In other words, since the bit line voltage is set equal to the precharge potential, namely to the plate voltage, if the sense amplifier is not activated even when the word line is selected and the memory cell is connected to the bit line, it is possible to prevent a high voltage from being applied to the information storing capacitor of the memory cell immediately after the power is turned ON.

Figure 9:
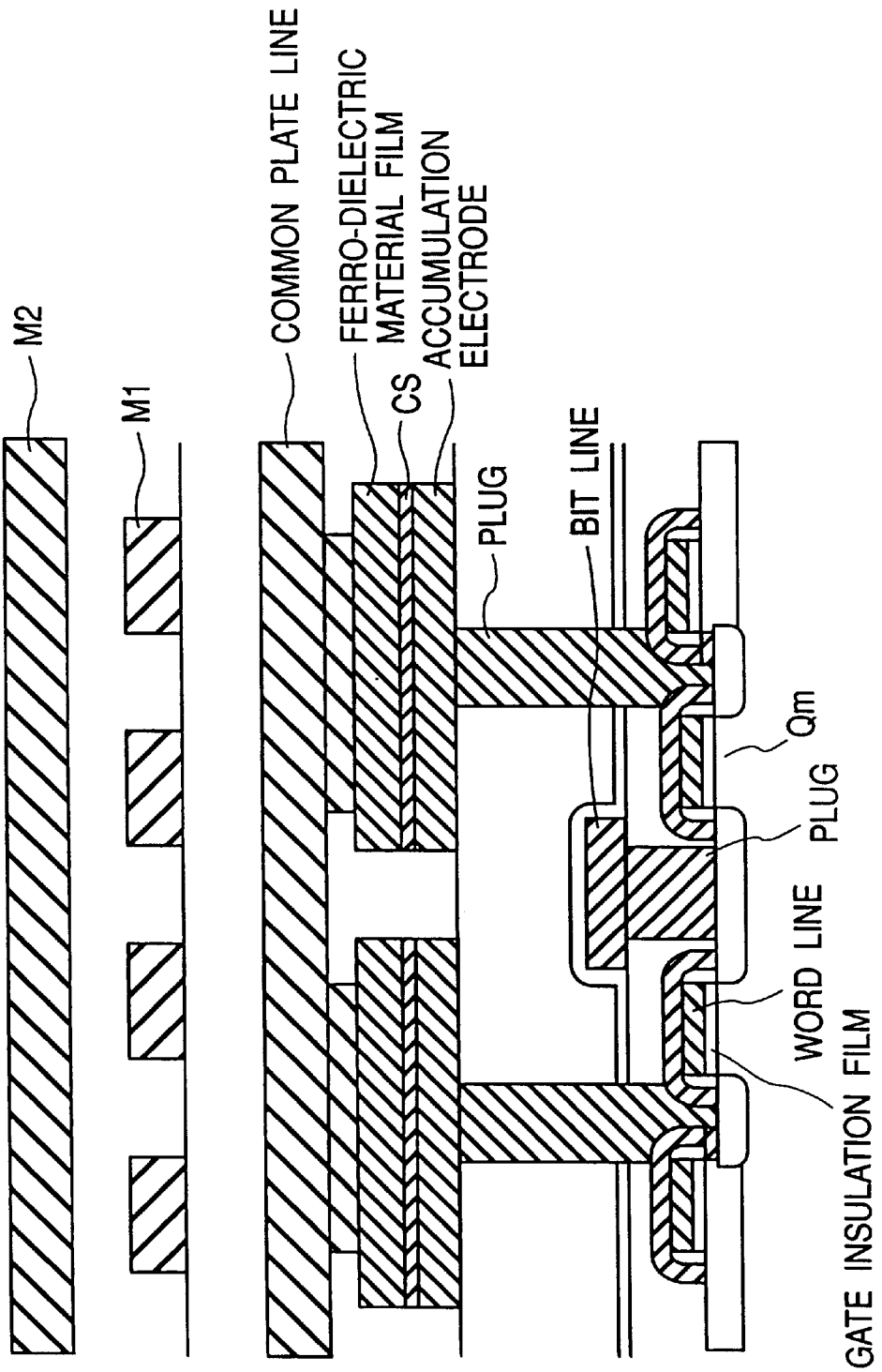
FIG. 9 is a schematic cross-sectional view of an element structure showing an embodiment of the memory cells of the present invention.

FIG. 9 shows schematic cross-sectional view of the structure of an embodiment of the memory cell of the present invention. The memory cell of this embodiment is basically similar in structure to the existing dynamic memory cell, except for the point that the dielectric material film forming the capacitor is a high dielectric coefficient material or ferro-dielectric coefficient material. The word line is formed of the gate insulated film and the first layer of polysilicon formed thereon to form an address selection MOSFETQm. One source and drain diffused layer of the MOSFETQm for address selection are used in common and are connected, although the invention is not particularly so restricted, to the bit line consisting of the second layer of polysilicon via the contact hole (plug).

In this embodiment, a ferro-dielectric material capacitor is formed, although the invention is not particularly so restricted, at the upper part of the MOSFETQm for address selection in order to assure a higher integration density. That is, the other source and drain of the address selection MOSFETQm are connected to the accumulation electrode as one electrode of the capacitor Cs for the contact hole. The capacitor Cs is formed of the accumulation electrode, high dielectric material film or ferro-dielectric material film end the other electrode such other electrode being used in common with that for the other memory cell by the common plate line, and then the plate voltage VPL is applied to the other electrode.

On the element forming region, a first layer of aluminum M1 and a second layer of aluminum M2 are formed. The aluminum layer M1 as the first layer is formed, although the invention is not particularly so restricted, as a word shunt which is easily connected to the word line in order to reduce the resistance value of the word line. The aluminum layer M2 is used as the second layer, although the invention is not particularly so restricted, for the Y selection signal line and power supply voltage line. If necessary, the aluminum layer M3 of the third layer is formed thereon.

For the dielectric material film, $Ta_2O_5$ is used as the high dielectric constant material, while PZT and BST are used as the ferro-dielectric constant material and an alloy such as Pt, etc. is used, although the invention is not particularly so restricted, for both electrodes. Moreover, as the ferro-dielectric constant material film, $BaMgF_4$, etc. may be used. A method of forming such ferro-dielectric material capacitor is described in detail, for example, in the magazine "Semiconductor World", PP. 122 to 125, Dec., 1991.

Figure 10:
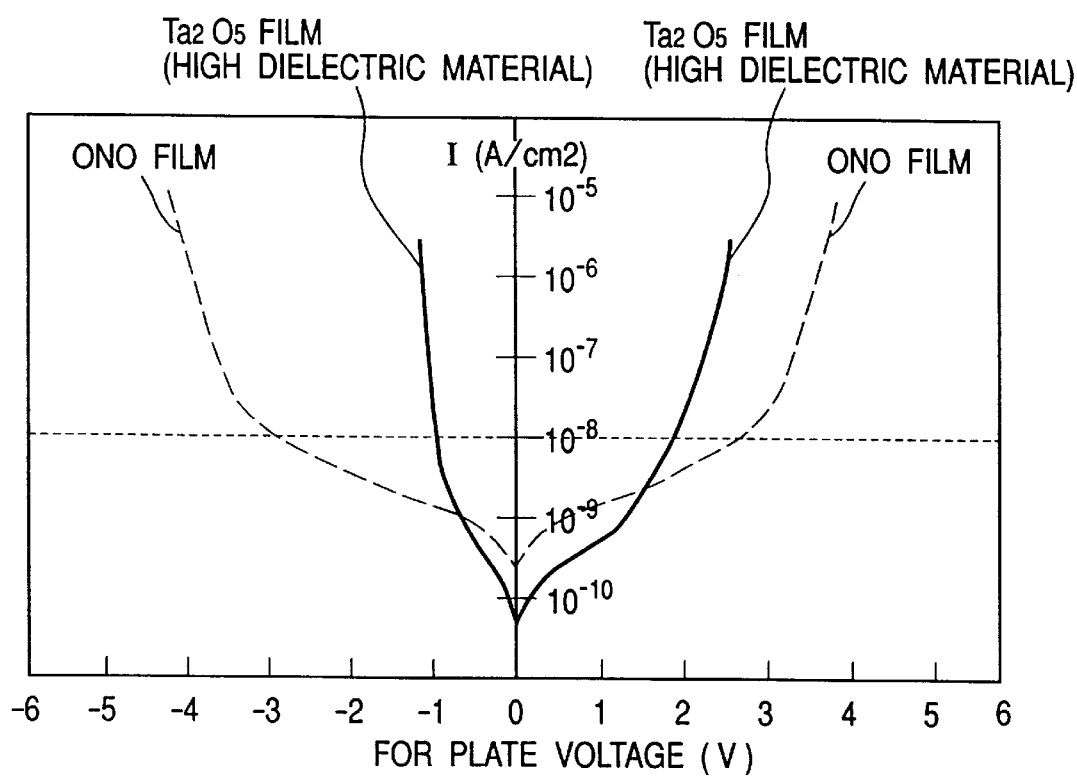
FIG. 10 is a voltage-current characteristic diagram of a high dielectric coefficient material for explaining the present invention.

In FIG. 10, a voltage—current characteristic diagram of the high dielectric constant material is shown to explain the present invention. In this figure, the $Ta_2O_5$ film is indicated as an example of the high dielectric constant material. As shown in this figure, it can be proven that the dielectric strength is small particularly in the negative direction for the plate voltage. That is, the characteristic diagram of the existing ONO film is indicated, but the $Ta_2O_5$ film shows a large leakage current and small dielectric strength in comparison with such ONO film. This tendency can also be observed even in the other ferro-dielectric constant material.

Figure 11A:
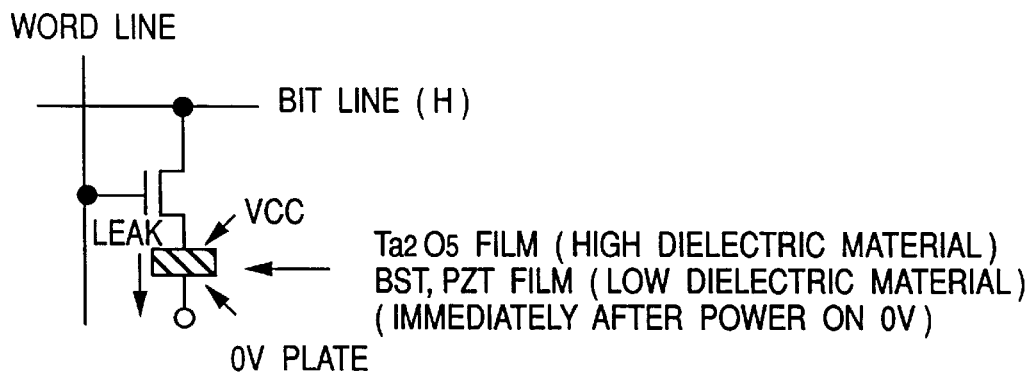
Figure 11B:
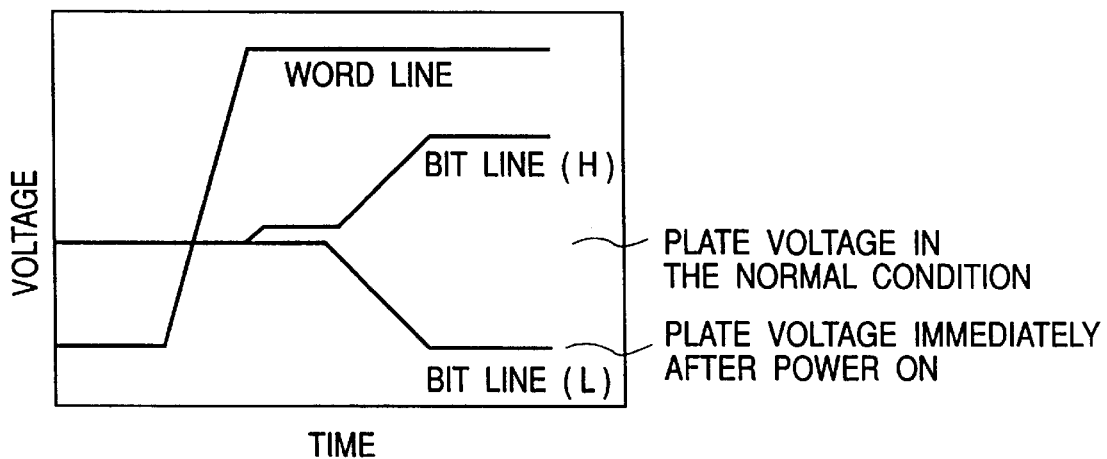

FIGS. 11A and 11B show the voltage which is applied to the memory cell when the power is turned ON. In FIG. 11A, the equivalent circuit is shown and in FIG. 11B, the potential at this time is indicated. When the word line is set to the high level selecting condition, the sense amplifier is activated and the potential of the bit line is set to a high/low level immediately after the power is turned ON, the high level VCC(H) of the bit line is applied across the electrodes of the capacitor, while the plate voltage VPL is still in the 0V condition. Meanwhile, under a steady state condition, since the plate voltage VPL is set to VCC/2, only a voltage equal to a half of the voltage immediately after the power is turned ON (VCC/2) is applied in a certain case.

If the monitor voltage is set to a value less than 1V, like VCC/4, when the $Ta_2O_5$ film is used gas in the above embodiment, it can be understood from the characteristic of FIG. 10 that the dielectric strength to the negative voltage is small for the plate voltage. That is, when the allowable value of the leakage current is set to $10^{-8} A/cm^2$, the voltage on the negative side preferably becomes 1V, while that on the positive side becomes 2V or higher.

Figure 12:
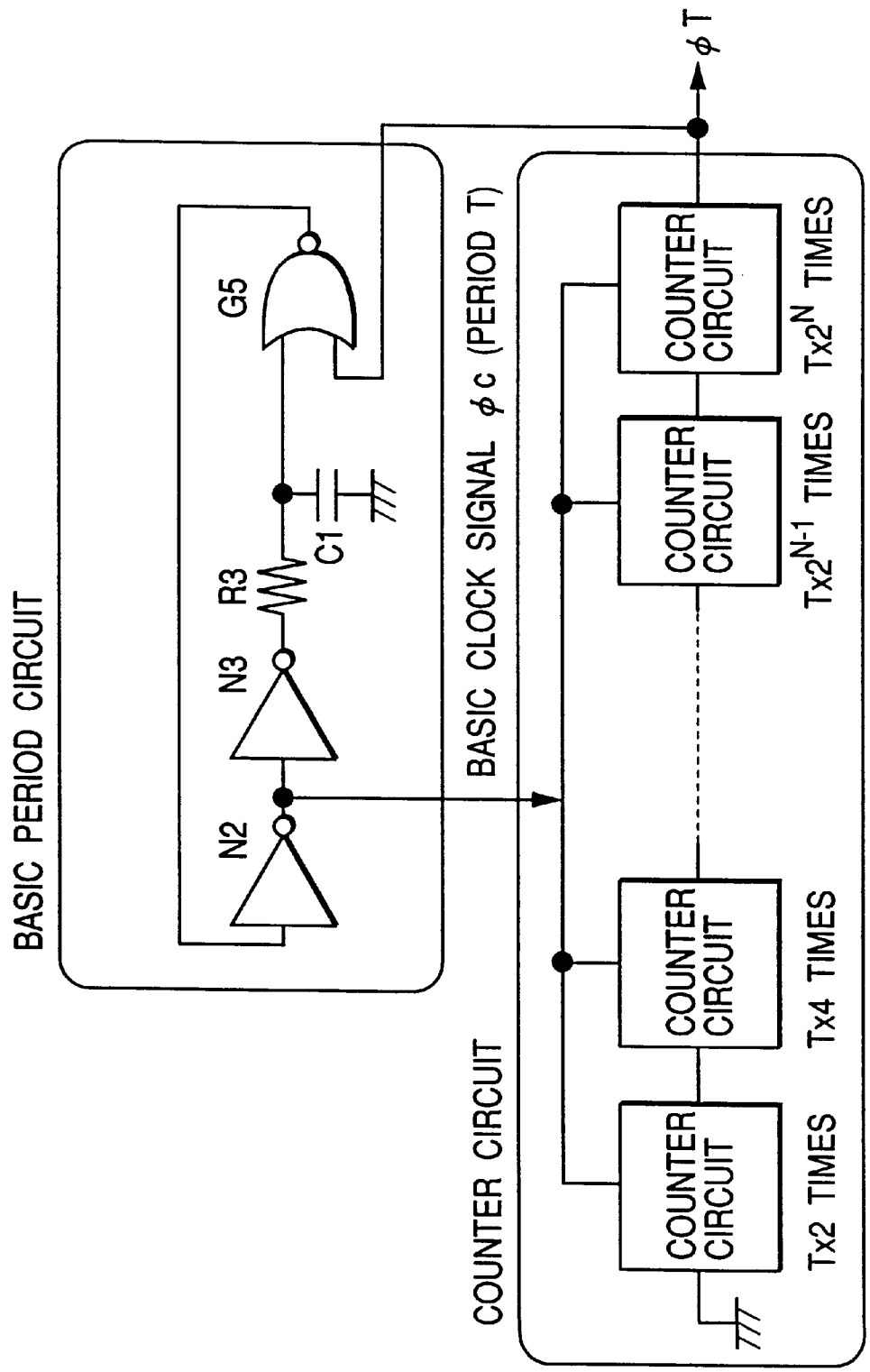
FIG. 12 is a circuit diagram showing a timer circuit used in another embodiment of the present invention.

FIG. 12 is a circuit diagram of a timer circuit which is used in a dynamic RAM representing another embodiment of the present invention. In this embodiment, the time corresponding to the rising time of the plate voltage is measured with a timer circuit in place of monitoring the plate voltage VPL itself, by focusing on the fact that the plate voltage VPL rises with a predetermined time constant. In other words, when a constant time has passed immediately after the power is turned ON, the plate voltage VPL is considered to have reached the predetermined voltage needed to allow the selection of the word line and operation of the sense amplifier.

In the same figure, a timer circuit for measuring the constant time is shown. A delay circuit (time constant circuit) consisting of inverter circuits N2, N3, resistor R3 and capacitor C1, and a NOR gate circuit G5 are connected in the form of a ring to form a ring oscillator. Immediately after the power is turned ON, an output φT of a counter circuit is set to the low level and the gate of the NOR gate circuit G5 is opened to substantially operate as an inverter circuit. Thereby, an oscillating operation is performed at a frequency corresponding to the signal propagation delay time (period T/2) of the inverter circuits N2, N3, delay circuit and NOR gate circuit G5 to form the basic clock signal φc.

The oscillation pulse φc formed by this oscillating operation is supplied to the counter circuit to execute the counting operation. The time required by the counting output φT in the counter circuit to change to the high level from the low level is determined corresponding to the time consumed by the plate voltage VPL to rise up to about 1V. Therefore, such timer output φT may be used like the plate voltage monitor signal φM. That is, in FIGS. 8A, 8B and 8C, the timer signal OT is used in place of the signal φM. Here, control is performed, in the circuit of FIG. 8A, to stop the word line selection signal φ1 and sense amplifier drive signal φs, in the circuit of FIG. 8B, to stop only the word line selection signal φ1 and in the circuit of FIG. 8C, to stop only the sense amplifier drive signal φs. When the signal φT is generated, the operation of the oscillating circuit and the counting operation are stopped for the purpose of reducing the power consumption.

Figure 13:
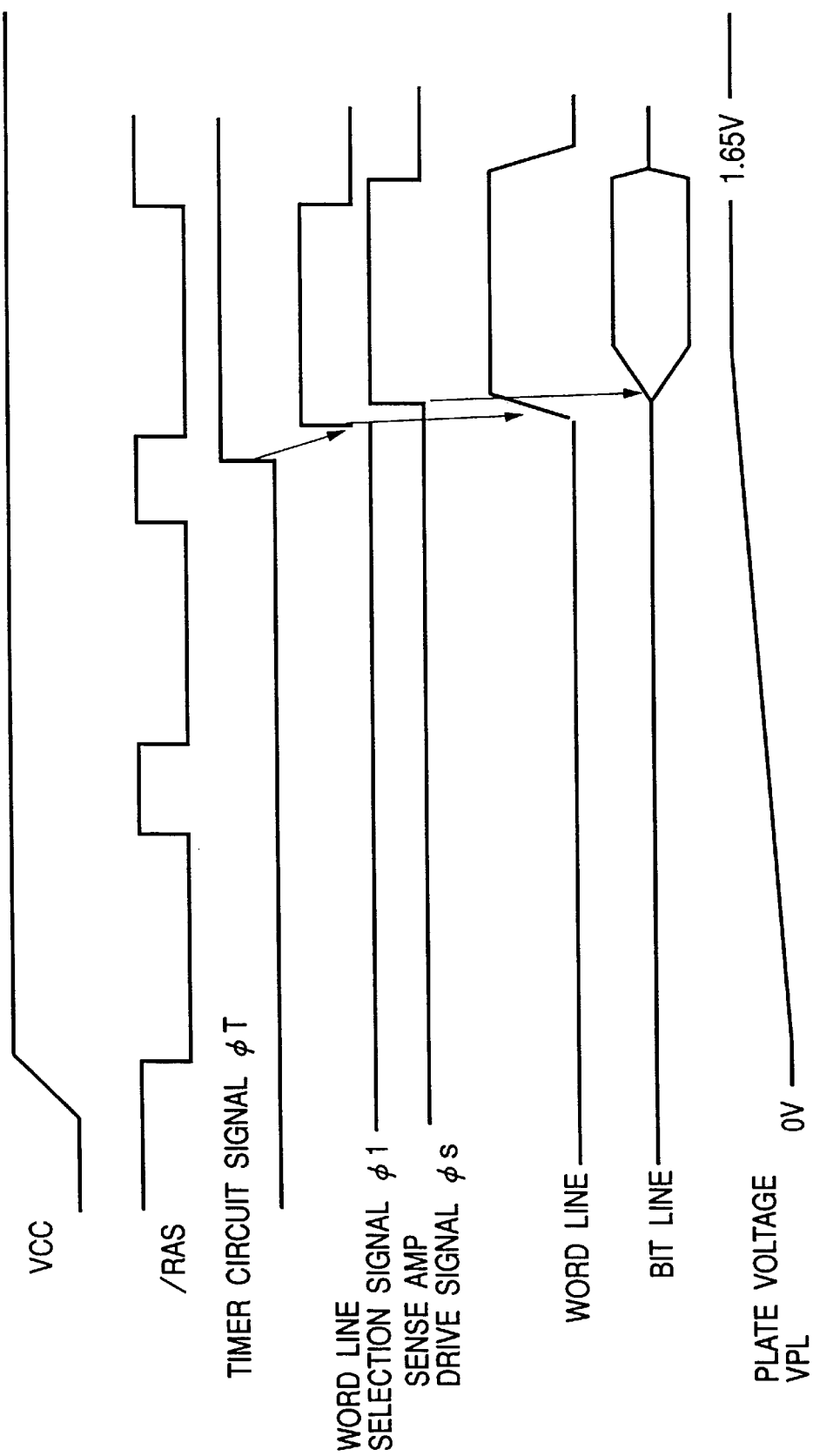

FIG. 13 shows waveform diagrams for explaining the operation of a dynamic RAM of the other embodiment of the present invention immediately after the power is turned ON. When the power is turned ON, the power supply voltage VCC rises. Even when the row address strobe signal /RAS is set to the low level for a memory access immediately after the power is turned ON, the plate voltage VPL is connected in common to a large number of memory cells and has a large parasitic capacitance. Therefore, the potential can only rise gradually depending on a comparatively large time constant.

In this case, since the signal φT is set to the low level in the timer circuit at such a time that the plate voltage VPL is lower than the monitor voltage VM, the word line selection signal φ1 and sense amplifier drive signal φs are kept in the low level, while the signal /RAS is set to the low level. Thereby, the word line is in the non-selecting condition and the bit line is maintained at the precharge voltage corresponding to the plate voltage VPL. Therefore, no substantial voltage difference is generated across both electrodes of the information storing capacitor and an unwanted higher voltage is not applied, with the result that the high dielectric material film or ferro-dielectric material film is never deteriorated.

When the time has come where the plate voltage VPL is considered to have reached a voltage about 1V, for example, which is higher than VCC/4, the timer circuit sets the timer output signal φT to the high level. Therefore, when the signal /RAS is set to the low level, the word line selection signal φ1 and sense amplifier drive signal φs are generated corresponding to such /RAS signal, the word line corresponding to the input address signal of this timing is selected and the potential of bit line is changed to a high/low level by the amplifying operation of the sense amplifier. Thereby, as explained above, in the information storing capacitor of the memory cell connected to the bit line by means of the bit line selecting operation, the plate voltage VPL rises up to almost about 1V, only 2.2V being applied to both electrodes of the capacitor where the potential 3.3 V of the bit line in the high level is transferred to the accumulation node, and only 1V is applied to both electrodes of the capacitor where the potential 0V of the bit line being set to the low level is transferred to the accumulation node.

Figure 14:
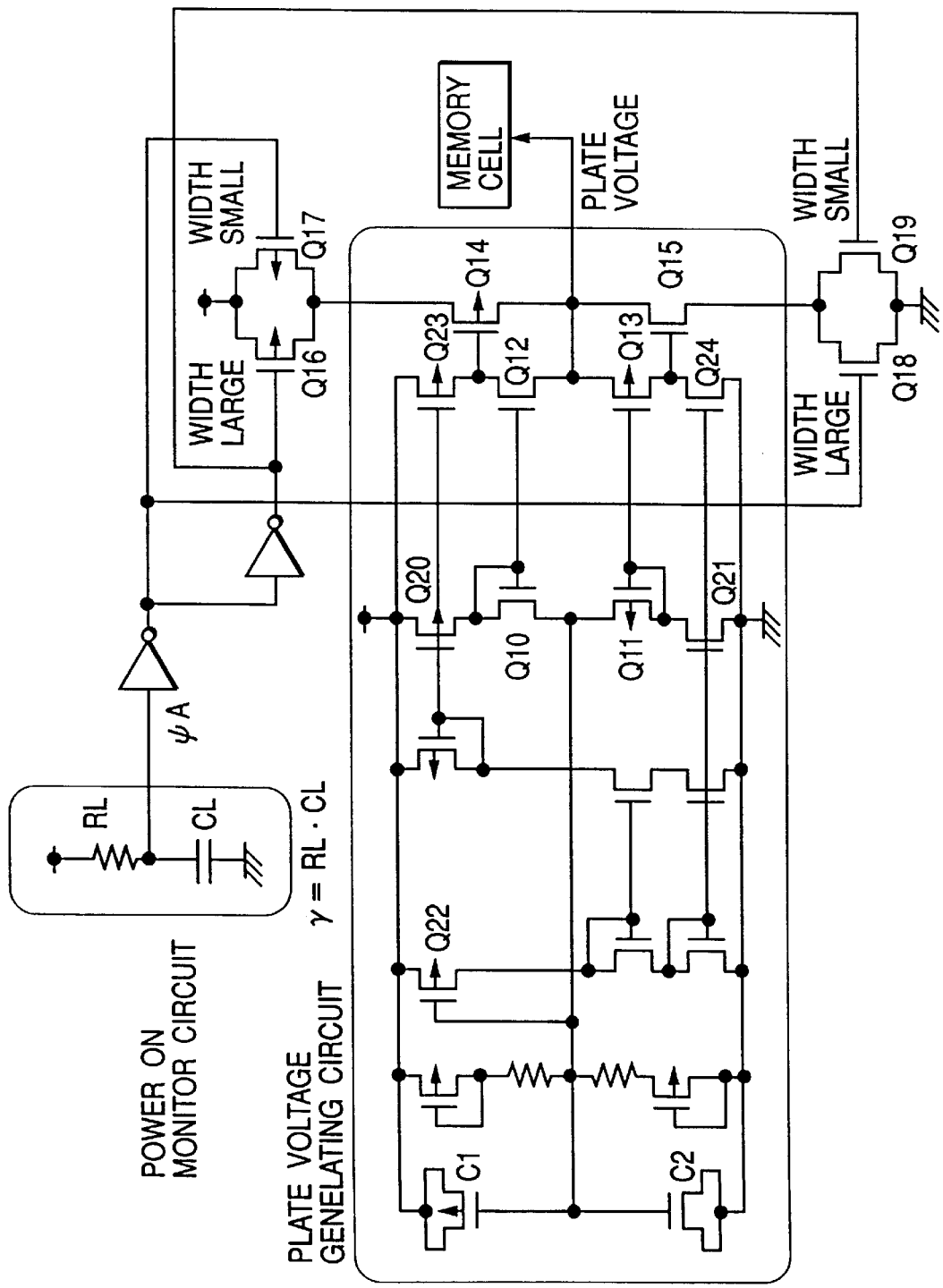
FIG. 14 is a schematic circuit diagram showing an embodiment of the plate voltage generating circuit used in the semiconductor memory device of the present invention.

FIG. 14 shows a circuit diagram of an embodiment of the plate voltage generating circuit used in the semiconductor memory device of the present invention. Since the source and drain of a MOSFET are connected in common, the power supply voltage VCC is divided by the series connected capacitors C1 and C2 using the gate capacitance, whereby the reference voltage VCC/2 is formed. Although the invention is not particularly so restricted, the capacitors C1 and C2 are respectively provided with a DC current path consisting of a high resistance circuit, including a MOSFET and a resistance element of diode mode, to form a stable reference voltage following the power supply voltage VCC.

The above reference voltage is supplied to the sources of the N-channel MOSFETQ10 and P-channel MOSFETQ11, the threshold value voltages of which are rather small. These MOSFETQ10 and MOSFETQ11 are respectively set in the diode mode by connecting in common the gate and drain thereof. Although the invention is not particularly so restricted, the P-channel MOSFETQ20 and N-channel MOSFETQ21 operating as a constant current source are respectively provided in the drain side of the MOSFETQ10 and MOSFETQ11 to supply the bias current. Thereby, MOSFETQ10 and MOSFETQ11 shift the level of the reference voltage supplied to the source corresponding to the threshold value voltage between the gate and the source.

In view of driving the constant current MOSFETQ20 and MOSFETQ21, the reference voltage is supplied to the gate of P-channel MOSFETQ22 to form a constant current. A drain current of the P-channel MOSFETQ22 is supplied to a current Miller circuit consisting of a N-channel MOSFET. On the one hand, this constant current is used to drive the N-channel type constant current MOSFETQ11 provided on the drain side of the P-channel MOSFETQ11, and, on the other hand, this current is used to drive the P-channel constant current MOSFETQ20 provided the drain side of the N-channel MOSFETQ10 via the current Miller circuit.

The reference voltage shifted in level by the N-channel MOSFETQ10 is then supplied to the gate of the N-channel MOSFETQ12. The reference voltage shifted in level by the P-channel MOSFETQ11 is then supplied to the gate of the P-channel MOSFETQ13. Both the N-channel MOSFETQ12 and the P-channel MOSFETQ13 are operated as a source follower MOSFET, and the sources are used in common and connected to the output terminal. These MOSFETQ12 and MOSFETQ13 are designed to have a threshold value voltage which is larger than the threshold value voltage of the MOSFETQ10 and MOSFETQ11 for level shift.

Therefore, when the output voltage which is equal to the reference voltage is VCC/2, the output MOSFETQ12 and MOSFETQ13 are set to the OFF condition and thereby a DC current is not allowed to flow because only a voltage smaller than the threshold value voltage is applied across the gate and source. If the output voltage is lower than the reference voltage (VCC/2) and it becomes larger than the difference between the threshold value voltages of the MOSFETQ10 and MOSFETQ12, the MOSFETQ12 turns ON to increase the output voltage. On the contrary, when the output voltage rises against the reference voltage (VCC/2) and it becomes larger than the difference of the threshold value voltages of MOSFETQ11 and MOSFETQ13, the MOSFETQ13 turns ON to reduce the output voltage. Basically, the output voltage is set to VCC/2 with such a control operation corresponding to the reference voltage.

In this embodiment, the output MOSFETQ12 and MOSFETQ13 are operated as amplifying elements to raise the sensitivity. That is, in the drain side of these MOSFETQ12 and MOSFETQ13, a similar constant current MOSFETQ23 and MOSFETQ24 are provided as the load, and the P-channel MOSFETQ14 and N-channel output MOSFETQ15 are driven with the amplified output of the drain thereof. In other words, when the output voltage is lowered for the reference voltage (VCC/2) and it becomes larger than the difference of the threshold value voltage of MOSFETQ10 and MOSFETQ12 to turn ON MOSFETQ12, MOSFETQ14 turns ON with its drain output to increase the output voltage.

On the contrary, when an output voltage increases against the reference voltage (VCC/2) and it becomes larger than the difference of threshold value voltages of MOSFETQ11 and MOSFETQ13 to turn ON MOSFETQ13, the MOSFETQ15 turns ON with its drain output to lower the output voltage. In this embodiment, such a control capability is enhanced when the power is turned ON to realize a quick rise of the plate voltage VPL but such control capability is lowered during the steady condition, whereby the plate voltage VPL is stabilized and the power consumption is lowered.

For such switching of the control capability, the power switch P-channel MOSFETQ16 and MOSFETQ17 are provided as power supply means in the source side of the P-channel MOSFETQ14 and the N-channel power switch MOSFETQ18 and MOSFETQ19 are also provided as ground potential supplying means of the circuit in the source side of the N-channel MOSFETQ15. The MOSFETQ16 and MOSFETQ18 are formed in a larger size W (channel width) to have a large current supply capability. The MOSFETQ17 and MOSFETQ19 are formed in a small size to have a small current supply capability.

The power supply input monitor circuit is a time constant circuit consisting of a resistor RL and a capacitor CL and forms a signal ΨA which rises depending on the time constant τ. The output signal becomes high level until this signal WA reaches the logic threshold voltage of a CMOS inverter circuit to turn on the large size MOSFETQ18 and also turn on MOSFETA16 with the inverted signal, as shown in the operation diagram of FIG. 15. That is, immediately after the power is turned ON, the plate voltage generating circuit is structured to cause a large output current to quickly rise to the plate voltage VPL. When the signal ΨA exceeds the logic threshold voltage of the CMOS inverter circuit, its output signal becomes low level to turn ON the small size MOSFETQ17 and MOSFETQ19 with its inverted signal. In other words, after the plate voltage VPL reaches VCC/2, the plate voltage generating circuit a limited comparatively small output current to flow to stabilize the plate voltage VPL.

Figure 15:
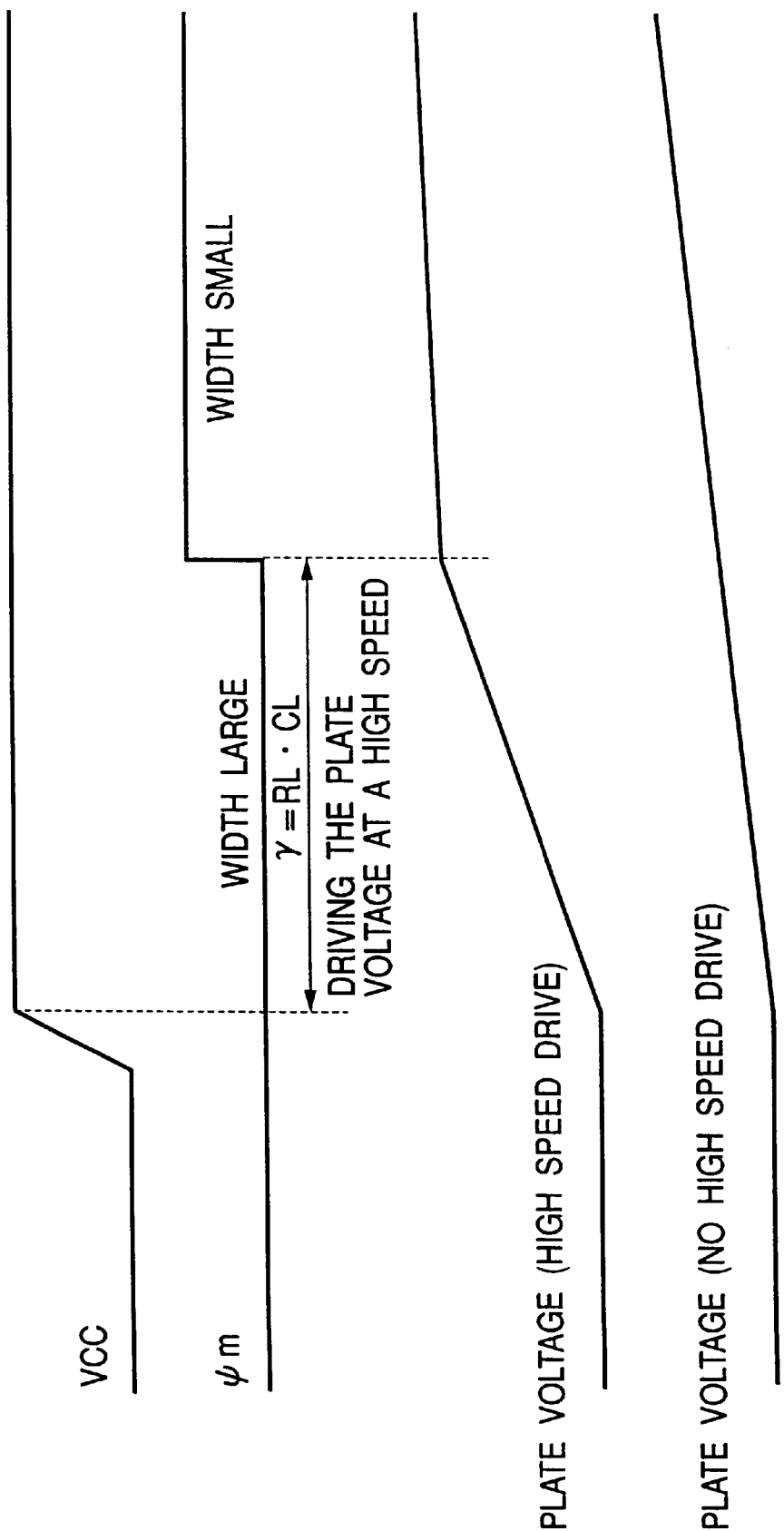

Therefore, as shown in FIG. 15, since the plate voltage VPL can rise more quickly than that when the high speed drive function is not added, such a setting time can accordingly be shortened when the timer circuit is used. In the system where the plate voltage is monitored, since the plate voltage VPL is monitored, the memory access within a comparatively short period from power ON can be realized depending on a change of the potential.

Figure 16:
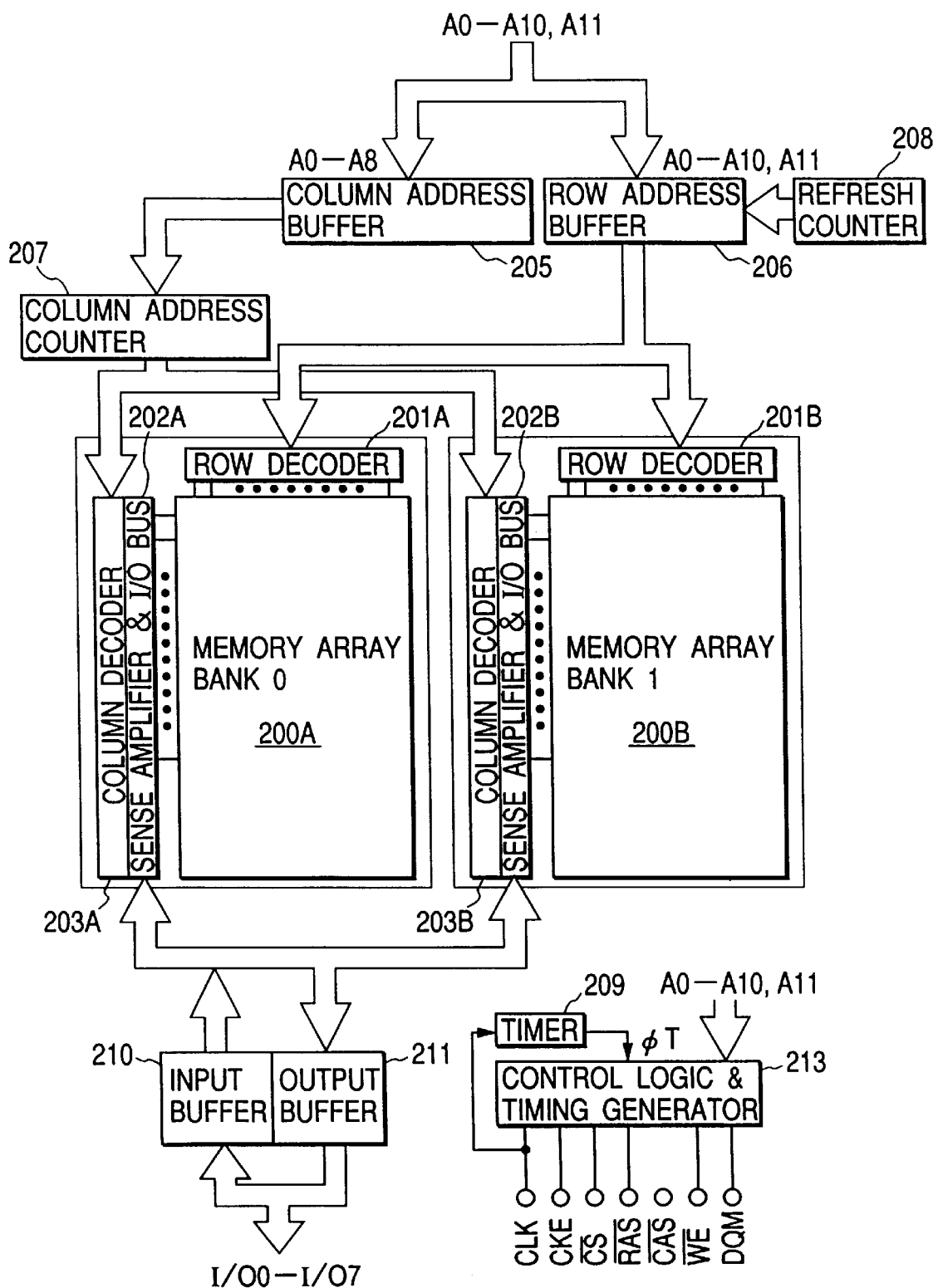
FIG. 16 is a schematic block diagram showing an embodiment of a synchronous DRAM to which the present invention is applied.

FIG. 16 shows a schematic block diagram of an embodiment of a synchronous DRAM (hereinafter referred only as SDRAM) to which the present invention is applied. The SDRAM shown in this figure is formed, although the invention is not particularly so restricted, on a semiconductor substrate such as single crystal silicon substrates by well-known semiconductor integrated circuit manufacturing technology.

The SDRAM in this embodiment is provided with a memory array 200A forming a memory bank 0 (BANK 0) and a memory array 200B forming a memory bank 1 (BANK 1). The respective memory arrays 200A and 200B are provided with dynamic memory cells arranged in the form of a matrix. According to the figure, the selection terminals of the memory cells arranged in the same column are coupled with the word lines (not illustrated) of each column and the data input/output terminals of the memory cells arranged in the same row are coupled with the data line pair (not illustrated) of each row.

The word lines not illustrated of the memory array 200A are driven only in one line to the selected level depending on the decoding result of the row address signal by the row decoder 201A. The data line pairs not illustrated of the memory array 200A are coupled with the sense amplifier and column selection circuit 202A. The sense amplifier, in the sense amplifier and column selection circuit 202A, is an-amplifying circuit for detecting a minute voltage difference appearing on a data line pair due to reading of the data from the memory cell and amplifying it. A column switch circuit in this amplifier circuit is a switch circuit for individually selecting the data line pair and connecting it to the common data line pair (I/O BUS). The column switch circuit is selected by the column decoder 203A depending on the decoding result of the column address signal.

As explained above, a row decoder 201B, a sense amplifier and column selection circuit 202B and a column decoder 203B are also provided on the side of the memory array 200B. The common data line pairs (I/O BUS) of the memory banks 200A and 200B are connected to the output terminals of the input buffer 210 and the input terminals of the output buffer 211 via a shift register 212 used for image processing, as will be explained later. The input terminal of the input buffer 210 and the output terminal of the output buffer 211 are connected to the data input/output terminals I/O0 to I/O7 of eight bits.

The row address signal and column address signal supplied from the address input terminals A0 to A11 are fetched in the address multiplex format by the column address buffer 205 and the row address buffer 206. The address signal supplied is held by the respective buffers 205 and 206. The row address buffer 206 fetches, as the row address signal, the refresh address signal output from the refresh counter 208 in the refresh mode. An output of the column address buffer 205 is supplied as the preset data of the column address counter 207 end the column address counter 207 will sequentially output the column address signal as preset data or the value obtained by sequentially incrementing such column address signal to the column decoders 203A and 203B, depending on the operation mode designated by the command explained later.

A controller (control logic & timing generator) 213 receives, although the invention is not particularly so restricted, external control signals, such as clock signal CLK, clock enable signal CKE, chip select signal /CS, column address strobe signal /CAS (sign/means that the signal given this sign is a row enable signal), row address strobe signal /RAS, write enable signal /WE and data input/output mask control signal DQM, control data from the address input terminals A0 to A11 and reference voltage Vref, and forms the internal timing signal for controlling the operation mode of the SDRAM and the operation of the circuit block on the basis of the level change and timing of the above signals. For this purpose, the controller 213 is provided with a control logic and mode register.

The clock signal CLK is the master clock signal of the SDRAM, and the other external input signals are synchronized as significant signals with the rising edge of the relevant internal clock signal. The chip select signal /CS instructs a start of the command input cycle with its low level. An input, when the chip select signal /CS is in the high level (chip non-selected condition), and the other input do not have any meaning. However, the memory bank selecting condition, will be explained later, and the internal operation, such as a burst operation, are not influenced by a change to the chip non-selecting condition. Each signal /RAS, /CAS, /WE is different in function from the corresponding signal in the ordinary DRAM, and these signals are significant when the command cycle described later is defined. The clock enable signal CKE indicates validity of the next clock signal. When the CKE signal is high level, the rising of the next clock signal CLK is considered valid, and when this signal is low level, it is considered invalid. Moreover, although not illustrated, in the read mode, the external control signal for the output enable control to the output buffer 211 is also supplied to the controller 213 and this signal is high level, for example, the output buffer 211 is set to the high output impedance condition.

The row address signal explained above is defined by the levels of A0 to A10 in the row address strobe bank active command cycle described later, synchronized with the rising edge of the crock signal CLK (internal clock signal). An input from A11 is considered as the bank selection signal in the row address strobe bank active commend cycle. That is, when the input of A11 is at the low level, the memory bank BANKA is selected and when the input is at the high level, the memory bank BANKB is selected. The memory bank selecting control can be realized, although the invention is not particularly so restricted, by activation of only row decoders on the side of selected memory banks, total non-selection of the column switch circuit on the side of the non-selected memory banks and connection to the input buffer 210 and output buffer 211 only on the side of the selected memory banks.

An input of A10 in the precharge command cycle to be described later indicates a profile of the precharge operation for the data line pair. The high level of this input indicates that the object of the precharge is both memory banks, and the low level of this input indicates that object of the precharge is one memory bank indicated by A11.

The column address signal is defined by the levels of A0 to A8 in the read or write command (column address read command, column address write command to be described later) cycle synchronized to the rising edge of the crock signal CLK (internal clock). The column address defined as explained above is considered as the stars address of a burst access.

For the address signal, clock signal, each control signal and data input/output signal explained above, a small amplitude interface such as SSTL or GTL is employed. That is, for the address buffer, clock buffer, control input buffer and data input buffer, a differential circuit similar to that in above embodiment is used, and an electrostatic protection circuit like that in the embodiment and a dummy circuit similar to this circuit are added in the input of such differential circuit.

Next, the main operation mode of the SDRAM instructed by the command will be explained.

(1) Mode register set command (Mo)

This command sets the mode register. This command is designated when /CS, /RAS, /CAS, /WE are low level and the data to be set (register set data) is given via AO to All. The register set data is set, although the invention is not particularly so restricted, as the burst length, CAS latency and write mode, etc. Although the invention is not particularly so restricted, the setting burst length can be set to 1, 2, 4, 8 and full page, the setting CAS latency can be set to 1, 2 and 3 and the setting write mode can be set to burst write and single write.

The CAS latency explained above indicates the number of cycles of the internal clock signal to be consumed until the output operation of output buffer 211 from the falling edge of the /CAS signal in the read operation instructed by the column address read command explained later. Until the read data is established, the internal operation time is required for reading of data and such operation time is set depending on the frequency used of the internal clock signal. In other words, when an internal clock signal having a higher frequency is used, the CAS latency is set to a relatively large value, and when an internal clock signal having lower frequency is used, the CAS latency is set to a relatively small value. Although the invention is not particularly so restricted, in the image processing operation explained later, it is also possible, if necessary, to set the CAS latency to a large value in order to acquire the changeover time of the word lines.

(2) Row address strobe bank active command (Ac)

This command is used to effectively instruct the row address strobe and select the memory bank by All. This command is instructed when /CS, /RAS are low level and /CAS, /WE are high level. In this case, the address supplied to AO to A10 is fetched as the row address signal, while the signal supplied to All is the memory bank selection signal. The fetching operation is executed synchronously with the rising edge of the internal clock signal as explained above. For instance, when this command is instructed, the word line in the memory bank designated thereby is selected and the memory cells connected to the word lines are connected to the corresponding data line pair.

(3) Column address read command (Re)

This command is required to start the burst read operation and also gives the instruction of the column address strobe. This command is instructed when /CS, /CAS are low level and /RAS, /WE are high level. In this case, the column address supplied to AO to A8 is fetched as the column address signal. The column address signal fetched thereby is supplied to the column address counter 207 as the burst start address. In the burst read operation instructed thereby, the memory bank and word line therein are selected previously in the row address strobe bank active command cycle and the memory cells of the selected word lines are sequentially selected and continuously read depending on the address signal output from the column address counter 107 in synchronization with the internal clock signal. The number of data read continuously is designated by the burst length. Moreover, stars of date reading from the output buffer 211 is executed after the number of cycles of the internal clock signal specified by the CAS latency.

(4) Column address write command (Wr)

When the burst write is set to the mode register as a profile of the write operation, this command is used to start the burst write operation. When the single write mode is set to the mode register as a profile of the write operation, this command is used to start the single write operation. Moreover, this command instructs the column address strobe in the single write and the burst write modes. This command is instructed when /CS, /CAS, /WE are low level and /RAS is high level. In this case, the address supplied to AO to A8 is fetched as the column address signal. The column address signal fetched thereby is supplied to the column address counter 207 as the burst start address in the burst write mode. The sequence of the burst write operation instructed, as explained above, is executed in the same manner as the burst read operation. However, the write operation does not include CAS latency, and fetching of the write data is started from the column address write command cycle.

(5) Precharge command (Pr)

This command is used to start the precharge operation for the memory bank selected by A10 and All and is instructed when /CS, /RAS and /WE are low level and /CAS is high level.

(6) Auto-refresh command

This command is used to start the auto-refresh mode and it is instructed when /CS, /RAS, and /CAS are low level and /WE and CKE are high level.

(7) Burst stop in full page command

This command is used to stop the burst operation of a full page for all memory banks and it is ignored for a burst operation other than a full page. This command is instructed when /CS and /WE are low level and /RAS and /CAS are high level.

(8) No operation command (Nop)

This command is used to instruct that the operation is not carried out substantially, and it is instructed when /CS is low level and/RAS, /CAS and /WE are high level In the SDRAM, when the burst operation is being carried out in one memory bank, if the other memory bank is designated during this operation and the row address strobe bank active command is supplied, row address operation in the relevant memory bank is enabled without exerting any influence on the operation in the one memory bank. For example, the S DRAM has means for holding data, an address and a control signal, and its holding contents, particularly the address and control signal, are held, although the invention is not particularly so restricted, in each memory bank. Otherwise, the data of one word line in the memory block selected by the row address strobe bank active command cycle is previously latched in the latch circuit not illustrated for the read operation before the column operation.

Therefore, so long as the data do not collide at the data input/output terminals I/O0 to I/07, the precharge command and row address strobe bank active command for the memory bank different from that as the processing object of command being executed are issued during the execution of a command not completed to start previously the internal operation.

An SDRAM can be defined as a memory which can input and output data, address or various control signals, such as /RAS and /CAS, etc. in synchronization with the internal clock signal based on the external crock signal CLK. The SDRAM is capable of operating a large capacity memory like a DRAM at a speed as high as an SRAM (static RAM). Moreover, it can continuously read or write a plurality of data by designating the number of data to be accessed for a selected word line with the burst length to change the selecting condition of the columns with the built-in column address counter 207.

In this embodiment, a timer 209 is provided. On the SDRAM, the timer circuit 209 measures the time when the power is turned ON by counting the clock signal CLK, focusing on that the clock signal CLK is supplied. Thereby, it is no longer required to provide the oscillation circuit explained above. An output signal $\phi T$ of the timer circuit 209 is used, as explained above, to stop the word line selecting signal and sense amplifier activating signal. In an SDRAM, it is also possible that the plate voltage VPL is monitored in place of providing the timer circuit 209 to stop the word line selecting operation and sense amplifier activating drive signal.

The effects of the embodiments explained above are as follow: (1) In a semiconductor memory device having a plurality of memory cells, each of which comprises address selection MOSFETs and information storing capacitors and allows the plate voltage formed of an intermediate potential to be applied to the common electrode of the information storing capacitor, only a voltage lower than the voltage in the steady condition and aging condition is applied to the high dielectric material film and ferro-dielectric material film of the capacitor to realize a capacitor of high reliability by detecting indirectly that the plate voltage has reached a predetermined potential near the intermediate potential using a voltage detecting circuit or a timer circuit and by inhibiting the word line selecting operation or precharging of the bit line pair to the intermediate potential when the plate voltage is lower than the predetermined potential and then enabling the memory access by canceling such operation after the plate voltage has reached the predetermined potential.

(2) According to the effect (1), even when the dielectric material film of the information storing capacitor having a dielectric strength of the ferro-dielectric constant material or high dielectric constant material which is weak for a potential difference of high level and low level of the bit line pair is used, a potential higher than the voltage difference of the bit line is not applied and therefore the material of the memory cell, which can obtain a large capacity with a small size, can be selected from a wider range.

(3) A quick rise of the plate voltage VPL can be realized by enhancing the output current capability of the plate voltage generating circuit immediately after the power is turned ON and the time required up to the enabling of the memory access from the power ON can be shortened while protecting the dielectric material film of the capacitor.

Although preferred embodiments of the present invention have been described and illustrated, it will be apparent to those skilled in the art that various modifications may be made without departing from the principles of the invention.

For example, the voltage comparing circuit to form a plate voltage monitor signal may be replaced, in addition to the circuit using the reference voltage as explained above, with a circuit using the logic threshold voltage of the CMOS inverter circuit as is used in the power ON monitor circuit of FIG. 14. In this case, in the ordinary CMOS inverter circuit, a comparatively high voltage like VCC/2 is used, but the logic threshold voltage is lowered up to about 1V by increasing the size of the N-channel MOSFET to be larger than the P-channel MOSFET or by detecting the plate voltage using the threshold voltage across the gate and the source of the N-channel MOSFET The above timer circuit may be replaced, in addition to the circuit counting the pulses as explained above, with a circuit which is used in the power ON circuit of FIG. 14 for obtaining an analog measurement of the time by making use of the time constant circuit. The plate voltage generating circuit may be the circuit to form the plate voltage with MOSFETQ12 and MOSFETQ13 shown in FIG. 14. In this case, the constant current source MOSFET provided in the drain side of the MOSFETQ12 and MOSFETQ13 may be eliminated.

The plate voltage VPL is set, as explained above, to the intermediate potential of the high and low levels of the bit line pair and is set to VCC/2 since the high level of the bit line is set to VCC. Therefore, when the intermediate potential of the high and low levels of the bit line is set without relation to the power supply voltage VCC, the plate voltage is set corresponding to the intermediate potential. Otherwise, the plate voltage may be set with deviation from the intermediate potential of the bit line so that the respective leakage currents become equal, corresponding to the positive and negative dielectric strength for the plate voltage of the high dielectric material layer or ferro-dielectric material layer used.

The present invention uses a memory cell consisting of an address selection MOSFET and information storing capacitor and therefore can be used widely in various semiconductor memory devices, such as a dynamic RAM, synchronous dynamic RAM or ferro-dielectric material memory, etc. Such semiconductor memory devices may be built in various kinds of semiconductor integrated circuit apparatus, including a control circuit to control this memory device.

We claim:

1. A semiconductor memory device, comprising:

a plurality of word lines;

a pair of bit lines crossing a plurality of said word lines;

a plurality of memory cells arranged at the crossing points of a plurality of said word lines and one bit line of said pair of bit lines wherein each memory cell has an information storing capacitor and a selection MOSFET and each selection MOSFET has a source-drain path provided between a corresponding bit line and one electrode of the information storing capacitor and a gate connected to a corresponding word line;

a plate voltage supply circuit which supplies a plate voltage in common to the other electrodes of said information storing capacitors, wherein said plate voltage supply circuit receives a power supply voltage and circuit grounding potential to generate said plate voltage being set to an intermediate potential of high level and low level potentials given to said pair of bit lines; and a plate voltage detecting circuit which detects whether said plate voltage has reached a predetermined potential or not, wherein when said plate voltage does not reach said predetermined potential, said word lines are inhibited to be selected and when said plate voltage has reached the predetermined potential, such inhibit condition is canceled.

2. A semiconductor memory device according to claim 1, wherein a dielectric material film of said information storing capacitor comprises a ferro-dielectric material or a high dielectric material.

3. A semiconductor memory device according to claim 1, wherein the dielectric material film of said information storing capacitor is formed of $Ta_2O_5$.

4. A semiconductor memory device according to claim 1, wherein the dielectric material film of said information storing capacitor is formed of BST.

5. A semiconductor memory device according to claim 1, wherein the dielectric material film of said information storing capacitor is formed of PZT.

6. A semiconductor device comprising:
a plurality of word lines;
a pair of bit lines;
a plurality of memory cells coupled to one of said plurality of word lines and one of said pair of bit lines, wherein each memory cell has a capacitor and a transistor coupled between one electrode of said capacitor and a corresponding bit line;
an amplifier coupled to said pair of bit lines, wherein said amplifier operates to receive a first voltage and a second voltage which is larger than said first voltage;
a voltage supply circuit which supplies a third voltage to the other electrodes of said capacitors, wherein said third voltage is larger than said first voltage and lower than said second voltage; and
a circuit which detects whether said third voltage has reached a predetermined potential or not,
wherein, when said third voltage does not reach said predetermined potential, said plurality of word lines are inhibited from being selected and when said third voltage has reached said predetermined potential, such inhibit condition is cancelled.

7. A semiconductor device according to claim 6, wherein a dielectric material film of said capacitor comprises a ferro-dielectric material or a high dielectric material.

8. A semiconductor device according to claim 6, wherein a dielectric material film of said capacitor is formed of Ta2O5.

9. A semiconductor device according to claim 6, wherein a dielectric material film of said capacitor is formed of BST.

10. A semiconductor device according to claim 6, wherein a dielectric material film of said capacitor is formed of PZT.

11. A semiconductor device according to claim 6, wherein, when said third voltage does not reach said predetermined potential after the power for said semiconductor device is turned ON, said plurality of word lines are inhibited from being selected, and, when said third voltage has reached said predetermined potential after the power for said semiconductor device is turned ON, such inhibit condition is cancelled.

12. A semiconductor device according to claim 6, wherein, when said memory cell stores first data, said one electrode of said capacitor of said memory cell is at said first voltage level, and
wherein, when said memory cell stores second data, said one electrode of said capacitor of said memory cell is at said second voltage level.

13. A semiconductor device according to claim 6, wherein said third voltage is substantially the middle potential between said first voltage and said second voltage.

14. A semiconductor device according to claim 13, wherein said third voltage is a center voltage between said first voltage and said second voltage.

15. A semiconductor device comprising:
a dynamic memory cell having a capacitor and a transistor having a source-drain path coupled between one electrode of said capacitor and a bit line;
a voltage generator which supplies a third voltage to the other electrodes of said capacitors; and
a circuit which detects whether said third voltage has reached a predetermined potential or not,
wherein, when said memory cell is in a first state, said one electrode of said capacitor of said memory cell is at a first voltage,
wherein, when said memory cell is in a second state, said one electrode of said capacitor of said memory cell is at a second voltage,
wherein said third voltage is larger than said first voltage and lower than said second voltage, and
wherein said dynamic memory cell is at a non-selecting state until said circuit detects that said third voltage has reached said predetermined potential.

16. A semiconductor device according to claim 15, wherein a dielectric material film of said capacitor comprises a ferro-dielectric material or a high dielectric material.

17. A semiconductor device according to claim 15, wherein a dielectric material film of said capacitor is formed of Ta2O5.

18. A semiconductor device according to claim 15, wherein a dielectric material film of said capacitor is formed of BST.

19. A semiconductor device according to claim 15, wherein a dielectric material film of said capacitor is formed of PZT.

20. A semiconductor device according to claim 15, wherein said plurality of word lines are at a non-selecting level until said circuit detects that said third voltage has reached said predetermined potential after the power for said semiconductor device is turned ON.

21. A semiconductor device according to claim 15, wherein said amplifier operates receiving said first voltage and said second voltage.

22. A semiconductor device according to claim 15, wherein said third voltage is substantially the middle potential between said first voltage and said second voltage.

23. A semiconductor device according to claim 22, wherein said third voltage is a center voltage between said first voltage and said second voltage.

24. A semiconductor device comprising:
a plurality of word lines;
a pair of bit lines;
a plurality of memory cells, wherein each memory cell has a capacitor and a transistor having a source-drain path coupled between one electrode of said capacitor and a corresponding one of said pair of bit lines and having a gate coupled to a corresponding one of said plurality of word lines;
an amplifier coupled to said pair of bit lines;
a voltage generating circuit; and
a voltage detecting circuit,
wherein, when said memory cell stores first data, said one electrode of said capacitor of said memory cell is a first voltage,
wherein, when said memory cell stores second data, said one electrode of said capacitor of said memory cell is a second voltage,
wherein said voltage generating circuit supplies a third voltage to the other electrodes of said capacitors, wherein said third voltage is larger than said first voltage and lower than said second voltage, wherein said voltage detecting circuit detects whether said third voltage has reached a predetermined potential or not, after the power for said semiconductor device is turned ON, and wherein said plurality of word lines are at a non-selecting level until said voltage detecting circuit detects that said third voltage has reached said predetermined potential after the power for said semiconductor device is turned ON.

25. A semiconductor device according to claim 24, wherein a dielectric material film of said capacitor comprises a ferro-dielectric material or a high dielectric material.

26. A semiconductor device according to claim 24, wherein a dielectric material film of said capacitor is formed of Ta2O5.

27. A semiconductor device according to claim 24, wherein a dielectric material film of said capacitor is formed of BST.

28. A semiconductor device according to claim 24, wherein a dielectric material film of said capacitor is formed of PZT.

29. A semiconductor device according to claim 24, wherein said amplifier operates receiving said first voltage and said second voltage.

30. A semiconductor device according to claim 24, wherein said third voltage is substantially the middle potential between said first voltage and said second voltage.

31. A semiconductor device according to claim 30, wherein said third voltage is a center voltage between said first voltage and said second voltage.

32. A semiconductor memory comprising:

a dynamic memory cell including a capacitor and a transistor having a source-drain path coupled between one electrode of said capacitor and a bit line;

a voltage generator which supplies the other electrode of said capacitor with a voltage; and a circuit which detects whether said voltage is at a predetermined potential or not, wherein said dynamic memory cell is at a non-selecting state unless said voltage is at said predetermined potential.

33. A semiconductor memory according to claim 32, wherein a dielectric material film of said capacitor comprises a ferro-dielectric material or a high dielectric material.

34. A semiconductor memory according to claim 32, wherein a dielectric material film of said capacitor is formed of Ta2O5.

35. A semiconductor memory according to claim 32, wherein a dielectric material film of said capacitor is formed of BST.

36. A semiconductor memory according to claim 32, wherein a dielectric material film of said capacitor is formed of PZT.

37. A semiconductor memory according to claim 32, wherein, when said voltage does not reach said predetermined potential after the power for said semiconductor memory is turned ON, said dynamic memory cell is inhibited from being selected, and, when said voltage has reached said predetermined potential after the power for said semiconductor memory is turned ON, such inhibit condition is cancelled.

38. A semiconductor memory according to claim 32, wherein, when said dynamic memory cell stores first data, said one electrode of said capacitor of said dynamic memory cell is at said first voltage level, and wherein, when said dynamic memory cell stores second data, said one electrode of said capacitor of said dynamic memory cell is at said second voltage level.

39. A semiconductor memory according to claim 38, wherein said voltage is an intermediate potential between said first voltage and said second voltage.

40. A semiconductor memory according to claim 39, wherein said voltage is a center voltage between said first voltage and said second voltage.

* * * * *